United States Patent
Ganivet et al.

(10) Patent No.: US 7,026,882 B2
(45) Date of Patent: Apr. 11, 2006

(54) TIME BASE CIRCUIT, OSCILLATOR BASED THEREON, AND COMMUNICATING APPARATUS USING SAID OSCILLATOR

(75) Inventors: Philippe Ganivet, Venelles (FR); Thierry Giovinazzi, Aix en Provence (FR); Francois Tailliet, Fuveau (FR)

(73) Assignee: STMicroelectronics SA, Montrouge (FR)

( * ) Notice: Subject to any disclaimer, the term of this patent is extended or adjusted under 35 U.S.C. 154(b) by 282 days.

(21) Appl. No.: 10/666,540

(22) Filed: Sep. 19, 2003

(65) Prior Publication Data

US 2005/0062519 A1 Mar. 24, 2005

(51) Int. Cl.
*H03K 3/353* (2006.01)

(52) U.S. Cl. ........................................ 331/143; 331/111
(58) Field of Classification Search ................. 331/143, 331/144, 111, 36 C, 185, 186
See application file for complete search history.

(56) References Cited

U.S. PATENT DOCUMENTS

| | | | | |
|---|---|---|---|---|
| 5,034,705 A | * | 7/1991 | Kolanko | ..................... 331/111 |
| 5,070,311 A | * | 12/1991 | Nicolai | ....................... 331/111 |
| 5,412,350 A | * | 5/1995 | Kim | ........................... 331/111 |
| 6,020,792 A | * | 2/2000 | Nolan et al. | ................ 331/111 |
| 6,107,894 A | * | 8/2000 | Van Tuijl et al. | ........... 331/143 |
| 6,552,622 B1 | * | 4/2003 | Shearon et al. | ............. 331/111 |
| 6,642,804 B1 | * | 11/2003 | Chrissostomidis et al. | .. 331/143 |

* cited by examiner

*Primary Examiner*—Robert Pascal
*Assistant Examiner*—Joseph Chang
(74) *Attorney, Agent, or Firm*—Lisa K. Jorgenson; Jose Gutman; Fleit, Kain, Gibbons, Gutman, Bongini & Bianco P.L.

(57) ABSTRACT

A time base circuit, for an oscillator and apparatus, defines a time interval in terms of a time taken for a capacitor to charge from a reference voltage level to a detection voltage level. The circuit operates by: supplying at the start of the interval a capacitor charging current, using a first semiconductor device supplied from a first power supply voltage, the device delivering the charging current according to a predetermined dependency on the first power supply voltage; and identifying the detection voltage level to signal the end of the time interval, using a second semiconductor device supplied from the first power supply voltage, the second semiconductor device identifying the detection voltage level value according to the same predetermined dependency on the first power supply voltage as for the first semiconductor device, the time interval being made substantially independent of variations of the first power supply voltage.

60 Claims, 8 Drawing Sheets

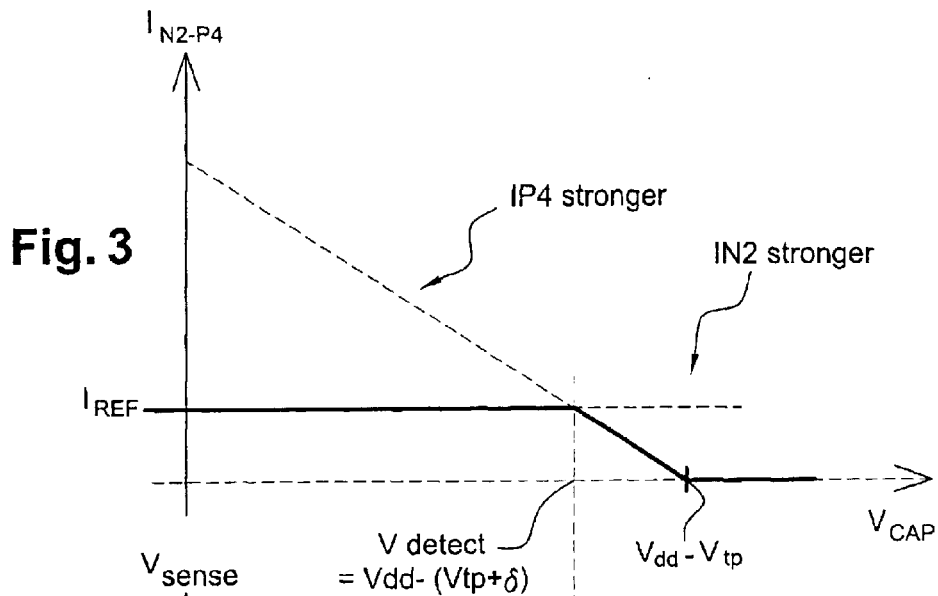
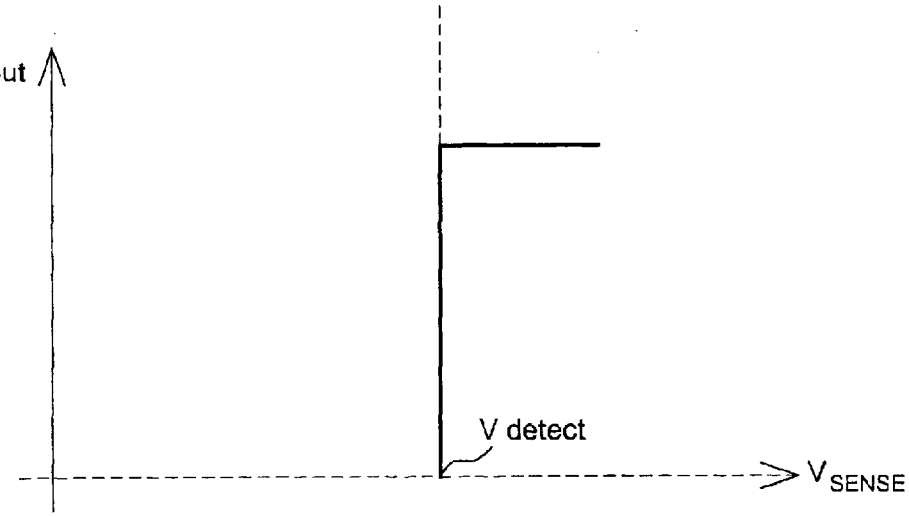

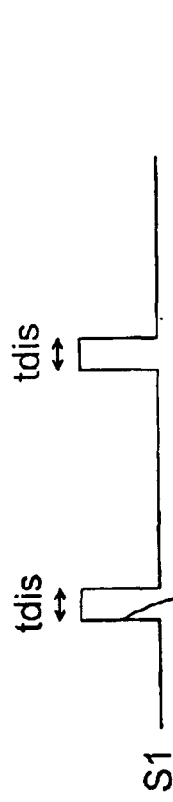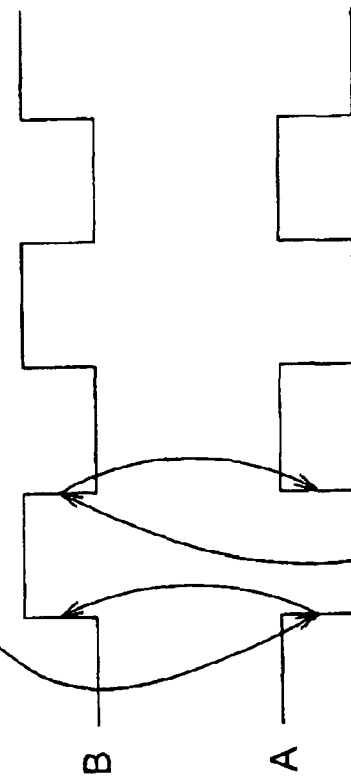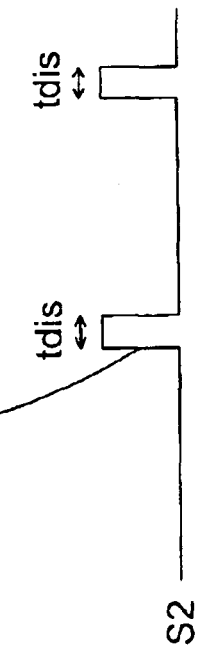
Fig. 9a
Fig. 9b
Fig. 9c
Fig. 9d
Fig. 9e

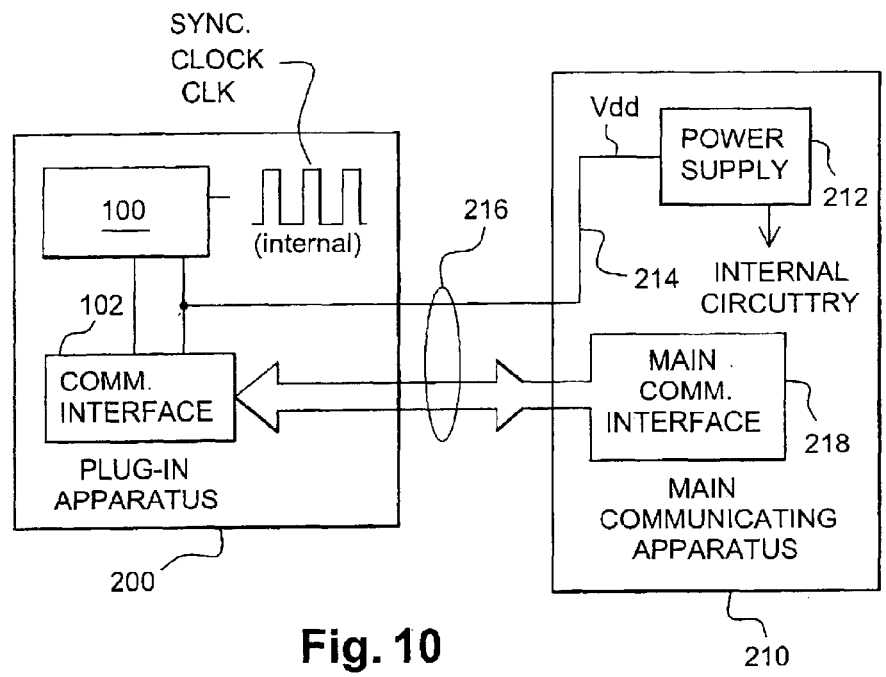
Fig. 10
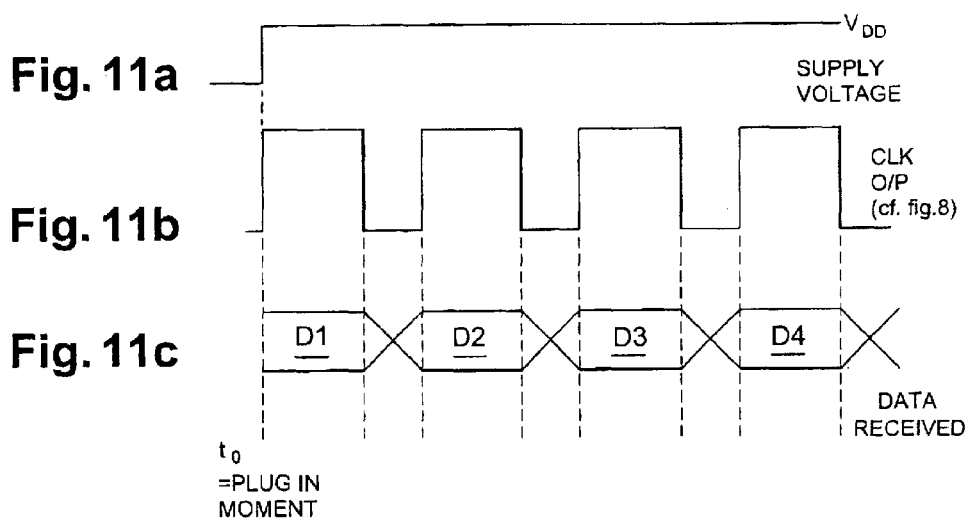
Fig. 11a
Fig. 11b
Fig. 11c

TIME BASE CIRCUIT, OSCILLATOR BASED THEREON, AND COMMUNICATING APPARATUS USING SAID OSCILLATOR

BACKGROUND OF THE INVENTION

1. Field of the Invention

The present invention relates to timing circuits, oscillators, and communication apparatus using oscillators, and more particularly to a time base circuit that establishes a time period in terms of the time taken to charge a capacitor to a particular voltage.

2. Description of the Prior Art

The principle of creating a time base using a determined current to charge a capacitor is in itself well known in the art. Such time bases are often implemented with current, supply voltage, and temperature stabilizing circuitry to ensure uniform characteristics over a range of operating conditions.

However, those of the prior art time bases that feature good accuracy tend to implement complex stabilizing circuitry—taking up a relatively large amount of chip space—and are relatively slow to start up.

Therefore a need exists to overcome the problems discussed above.

SUMMARY OF THE INVENTION

According to a preferred embodiment of the present invention, a time base circuit establishes a time period in terms of the time taken to charge a capacitor to a particular voltage. The time base circuit can serve as a basis for constructing an oscillator circuit, also subject of the present invention, where it can offer rapid starting after power up, a uniform starting waveform comprising an initial complete half-wave, and good frequency stability without recourse to complex compensation circuitry. The oscillator according to the invention can be used in a wide variety of applications, e.g. for generating low-frequency clock signals in so-called plug-and-play type chips. In such applications, the on-chip oscillator is required to start running and reach a steady frequency very soon after power up, where the moment of plug-in creates the powering up of the circuit. Typically, the power supply to the oscillator is provided by the apparatus to which it is plugged in.

According to one aspect of the present invention is to provide a quick-starting, relatively compact time base, operating on the above capacitor charging principle, while offering good precision.

The design concept according to a preferred embodiment does not rely on a highly stable current source to achieve temporal precision, while enabling the time measurement to be stable and substantially unaffected by variations in the power supply voltage. Indeed, the charge level detection method used automatically compensates for power supply voltage variations, thereby relieving the design constraint on the current source.

More particularly, according to a first aspect, the invention provides a method of establishing a time interval in terms of a time taken for a capacitor to charge from a reference voltage level to a detection voltage level, comprising the steps of:

supplying at the start of the interval a capacitor charging current, using a first semiconductor device supplied from a first power supply voltage, the device delivering the charging current to said capacitor according to a predetermined dependency on the first power supply voltage, identifying the detection voltage level to signal the end of the time interval, using a second semiconductor device supplied from the first-power supply voltage, the second semiconductor device identifying the detection voltage level value according to the same predetermined dependency on the first power supply voltage as for the first semiconductor device, whereby the time interval is made substantially independent of variations of the first power supply voltage.

Advantageously, the predetermined dependency is a function of the difference between: i) a voltage supplied, from the first power supply voltage, to the first and second semiconductor devices and ii) a threshold voltage of the first and second semiconductor devices.

The first and second semiconductor devices are matched transistors, and can have a control input biased by a biasing signal to deliver a constant current.

The second semiconductor device can comprise a transistor placed in a current flow path passing a current substantially equal to the charging current while the capacitor is being charged.

The first and second semiconductor devices can be placed in first and second current flow paths controlled to pass substantially the same current during the time interval.

The current flow in the first and second current flow paths can be controlled by a control signal obtained from respective branches of a current mirror circuit.

The latter can be formed two current mirror transistors in respective current branches and connected as back-to-back transistors, a first the current mirror transistor being connected in series with a resistive device to establish a reference current, and a second the current mirror transistor being connected in series with a diode connected transistor, and wherein the first semiconductor device is a transistor biased by a signal taken from the common node of the back-to-back transistors and the current passing through the second semiconductor device is controlled by a transistor biased by the common node of the second current mirror transistor and the diode connected transistor.

The transistors of the current mirror circuit can MOS transistors, preferably having substantially equal threshold voltages and connected to a same power supply voltage. In the preferred embodiments, the first and second semiconductor devices are PMOS transistors, both PMOS transistors having substantially equal threshold voltages and connected to a same positive power supply voltage.

The reference voltage can be at ground potential and the detection voltage corresponds to the first power supply voltage, minus the threshold voltage of the first semiconductor device when in the conducting state.

The method can further comprise supplying a detection signal from the second semiconductor device, indicative of the detection of the detection voltage, to a Schmitt trigger set to deliver predetermined logic voltages as a function of the voltage value of the detection signal.

In the preferred embodiments:

the first semiconductor device is a first PMOS transistor having a source connected to the first power supply voltage, and a drain connected to a first terminal of the capacitor, the capacitor having a second terminal connected to the reference voltage, the second semiconductor device is a second PMOS transistor having a source connected to the first power supply voltage, and a drain connected to a drain of a first NMOS transistor, whose source connected to the reference voltage, the first PMOS transistor and the first NMOS are biased at their gates by respective first and second voltage signals obtained from a current mirror circuit composed of two PMOS current mirror transistors in respective current branches and connected back-to-back by their gates, a first the current mirror transistor being connected in series with a resistive device to establish a reference current, and a second the current mirror transistor connected in series with a second NMOS transistor having its drain connected to its gate, the gate of the first PMOS transistor being biased by a signal taken from the common node of the back-to-back transistors, and the gate of the first NMOS transistor being biased by the common node of the second current mirror transistor and the drain of the second NMOS transistor.

According to a second aspect, the invention relates to a method of generating an oscillating signal having a periodicity established by a time taken for a capacitor to charge from a reference voltage to a detection voltage level, comprising the steps of:

supplying at the start of the interval a capacitor charging current, using a first semiconductor device supplied from a first power supply voltage, the device delivering the charging current to said capacitor according to a predetermined dependency on the first power supply voltage, identifying the detection voltage level to signal the end of the time interval, using a second semiconductor device supplied from the first power supply voltage, the second semiconductor device identifying the detection voltage level value according to the same predetermined dependency on the first power supply voltage as for the first semiconductor device, whereby the time interval is made substantially independent of the first power supply voltage, discharging the capacitor to the reference voltage after the second semiconductor device identifies the detection voltage level, repeating the supplying, identifying and discharging steps cyclically, and producing the oscillating signal on the basis of the corresponding cyclical detection of the detection voltage level.

The method can further comprise extracting a response signal produced by the second semiconductor device in response to a detection of the detection voltage level, and using the response signal to establish the periodicity of the oscillating signal.

Preferably, it can also comprise using the response signal to trigger logic levels changing in correspondence with the periodicity of the response signal, the triggered logic levels forming the oscillator output signal.

Switching means can be provided in the current supply path at a given point between the first terminal of the capacitor and the first power supply voltage, the switching means being responsive to a periodic signal generated from the detection signal for periodically blocking a supply of current to the capacitor.

Switchable capacitor discharging means can be provided for selectively connecting the first terminal of the capacitor to the reference voltage to discharge the capacitor, the switchable capacitor discharging means being responsive to a periodic signal generated from the detection signal for periodically discharging the capacitor.

According to a third aspect, the invention provides a method of generating an oscillating signal having a periodicity established by a time taken for a capacitor to charge from a reference voltage to a detection voltage level, comprising:

providing first and second time bases, each comprising:
  means for supplying a capacitor with a charging current, comprising a first semiconductor device supplied from a first power supply voltage, the device delivering the charging current to said capacitor according to a predetermined dependency on the first power supply voltage,
  means for identifying the detection voltage level to signal the end of the time interval, comprising a second semiconductor device supplied from the first power supply voltage, the second semiconductor device identifying the detection voltage level value according to the same predetermined dependency on the first power supply voltage as for the first semiconductor device, whereby the time interval is made substantially independent of the first power supply voltage, and
  means for discharging the capacitor to the reference voltage after the second semiconductor device identifies the detection voltage level,
causing the first and second time bases to operate in alternation by initially starting the charging of the capacitor of the first time base, and cyclically using the detection of the detection voltage of the first time base to both start the charging of the capacitor of the second time base and to discharge the capacitor of the first time base,
using the detection of the detection voltage of the second time base to both start the charging of the capacitor of the first time base and to discharge the capacitor of the second time base, and
using the resulting cyclic detection of a detection voltage at one or both time bases as a time base to produce the oscillating signal.

According to a fourth aspect, the invention relates to a method of generating an oscillating signal having a periodicity established by a time taken for a capacitor to charge from a reference voltage to a detection voltage level, comprising:

providing first and second time bases, each comprising:
  means for supplying the capacitor with a charging current, comprising a first semiconductor device supplied from a first power supply voltage, the device delivering the charging current to said capacitor according to a predetermined dependency on the first power supply voltage,
  means for identifying the detection voltage level to signal the end of the time interval, comprising a second semiconductor device supplied from the first power supply voltage, the second semiconductor device identifying the detection voltage level value according to the same predetermined dependency on the first power supply voltage as for the first semiconductor device, whereby the time interval is made substantially independent of the first power supply voltage, and
  means for discharging the capacitor to the reference voltage after the second semiconductor device identifies the detection voltage level,
performing cyclical steps a) to d) below:
  a) charging the capacitor of the first time base through the first semiconductor device thereof,
  b) in response to the second semiconductor device of the first time base signalling the detection of the detection voltage value, charging the capacitor of the second time base through the first semiconductor device of the second time base, c) discharging the capacitor of the first time base to the reference voltage while the capacitor of the second time base is being charged, d) in response to the second semiconductor device of the second time base signalling the detection of the detection voltage value, returning to cyclical step a) and discharging the capacitor of the second time base prior to cyclical step b), thereby producing the oscillating signal on the basis of the cyclical alternation of detecting the detection voltage by the first and/or the second time base(s).

The above method can further comprise the step of providing logic gating circuit means for causing the detection of the detection voltage by the first time base to trigger cyclical steps b) and c), and for causing the the detection of the detection voltage by the second time base to trigger cyclical step d) and, after a first cycle, cyclical step a).

It can also comprise the steps of providing switching means at each of the first and second time bases, in the first current path, the switching means of the first time base being responsive to a detection of the detection voltage by the second time base for preventing a supply of current to the capacitor of the first time base, and the switching means of the second time base being responsive to a detection of the detection voltage by the first time base for preventing a supply of current to the capacitor of the second time base.

For each of the first and second time bases, there can be proviced switchable capacitor discharging means for selectively connecting the first terminal of a respective the capacitor to the reference voltage to discharge the capacitor, the switchable capacitor discharging means of the first time base being responsive to a detection of the detection voltage by the second semiconductor device of the first time base to connect the first terminal of the capacitor of the first time base plate to the reference voltage, and the switchable capacitor discharging means of the second time base being responsive to a detection of the detection voltage by the second semiconductor device of the second time base to connect the first terminal of the capacitor of the second time base plate to the reference voltage.

According to a fifth aspect, the invention provides a device for establishing a time interval in terms of a time taken for a capacitor to charge from a reference voltage level to a detection voltage level, comprising:

means for supplying at the start of the interval a capacitor charging current, comprising a first semiconductor device supplied from a first power supply voltage, the device delivering the charging current to said capacitor according to a predetermined dependency on the first power supply voltage, and means for identifying the detection voltage level to signal the end of the time interval, comprising a second semiconductor device supplied from the first power supply voltage, the second semiconductor device identifying the detection voltage level value according to the same predetermined dependency on the first power supply voltage as for the first semiconductor device, whereby the time interval is made substantially independent of variations of the first power supply voltage.

According to a sixth aspect, the invention provides a device for generating an oscillating signal having a periodicity established by a time taken for a capacitor to charge from a reference voltage to a detection voltage level, comprising:

means for supplying at the start of the interval a capacitor charging current, using a first semiconductor device supplied from a first power supply voltage, the device delivering the charging current to said capacitor according to a predetermined dependency on the first power supply voltage, means for identifying the detection voltage level to signal the end of the time interval, using a second semiconductor device supplied from the first power supply voltage, the second semiconductor device identifying the detection voltage level value according to the same predetermined dependency on the first power supply voltage as for the first semiconductor device, whereby the time interval is made substantially independent of the first power supply voltage, means for discharging the capacitor to reference voltage after the second semiconductor device identifies the detection voltage level, means for operating cyclically the supplying, identifying and discharging steps cyclically, to produce the oscillating signal on the basis of the corresponding cyclical detection of the detection voltage level.

According to a seventh aspect, the invention provides a device for generating an oscillating signal having a periodicity established by a time taken for a capacitor to charge from a reference voltage to a detection voltage level, comprising:

first and second time bases, each comprising:

means for supplying a capacitor with a charging current, comprising a first semiconductor device supplied from a first power supply voltage, the device delivering the charging current to said capacitor according to a predetermined dependency on the first power supply voltage, means for identifying the detection voltage level to signal the end of the time interval, comprising a second semiconductor device supplied from the first power supply voltage, the second semiconductor device identifying the detection voltage level value according to the same predetermined dependency on the first power supply voltage as for the first semiconductor device, whereby the time interval is made substantially independent of the first power supply voltage, and means for discharging the capacitor to the reference voltage after the second semiconductor device identifies the detection voltage level, control means for causing the first and second time bases to operate in alternation by initially starting the charging of the capacitor of the first time base, the control means being operative for cyclically:

using the detection of the detection voltage of the first time base to both start the charging of the capacitor of the second time base and to discharge the capacitor of the first time base, using the detection of the detection voltage of the second time base to both start the charging of the capacitor of the first time base and to discharge the capacitor of the second time base, and means responsive to the resulting cyclic detection of a detection voltage at one or both time bases as a time base to produce the oscillating signal.

According to an eighth aspect, the invention relates to a device for generating an oscillating signal having a periodicity established by a time taken for a capacitor to charge from a reference voltage to a detection voltage level, comprising:

first and second time bases, each comprising:

means for supplying a capacitor with a charging current, comprising a first semiconductor device supplied from a first power supply voltage, the device delivering the charging current to said capacitor according to a predetermined dependency on the first power supply voltage, means for identifying the detection voltage level to signal the end of the time interval, comprising a second semiconductor device supplied from the first power supply voltage, the second semiconductor device identifying the detection voltage level value according to the same predetermined dependency on the first power supply voltage as for the first semiconductor device, whereby the time interval is made substantially independent of the first power supply voltage, and means for discharging the capacitor to the reference voltage after the second semiconductor device identifies the detection voltage level, and means for performing cyclical steps a) to d) below:
a) charging the capacitor of the first time base through the first semiconductor device thereof,
b) in response to the second semiconductor device of the first time base signalling the detection of the detection voltage value, charging the capacitor of the second time base through the first semiconductor device of the second time base,
c) discharging the capacitor of the first time base to the reference voltage while the capacitor of the second time base is being charged,
d) in response to the second semiconductor device of the second time base signalling the detection of the detection voltage value, returning to cyclical step a) and discharging the capacitor of the second time base prior to cyclical step b), thereby producing the oscillating signal on the basis of the cyclical alternation detecting the detection voltage by the first and/or the second time base(s).

The features, taken alone or in combination, of the invention presented in the scope of a method are applicable mutatis to the device according to the fifth to eighth aspects.

According to a ninth aspect, the invention relates to the use of the device according to any one of the fifth to eighth aspects to form an oscillator generating a waveform substantially immediately after supplying the first power supply voltage, with an initial half wave starting substantially at a normal point in the phase of the waveform, the initial half wave having a duration substantially equal to a cycle period of the waveform.

According to a tenth aspect, the invention provides an apparatus comprising a time base circuit according to any one of the fifth to eighth aspects, the apparatus being pluggable into a second apparatus to exchange therewith data a data rate according to the oscillating frequency of the oscillating device substantially immediately upon being plugged to the second apparatus, and receiving the first power supply from the second apparatus.

BRIEF DESCRIPTION OF THE DRAWINGS

The invention and its advantages will be more clearly understood from reading the following detailed description of the preferred embodiments, given purely as non-limiting examples, with reference to the appended drawings indicated below.

FIG. 3 is a curve which reproduces the static current IN2 and IP4 =f(Vcap) respectively of a second NMOS and a fourth PMOS transistor used in the circuit of FIG. 1.

FIG. 4 is a curve which reproduces the voltage at the input Vdetect=f(Vcap) of the circuit of FIG. 1.

FIG. 5 is a curve that produces the output of a Schmitt trigger in response to the input shown in FIG. 4.

FIGS. 9a to 9e are timing charts showing signals at different points of the oscillator of FIG. 7 during operation.

FIG. 10 is a simplified block diagram of a plug-in type apparatus implementing an oscillator based on the time base circuit of FIG. 1, designed to be operative for receiving data immediately upon being plugged into an apparatus from which it is powered.

FIGS. 11a to 11c are timing diagrams of signals used with the apparatus of FIG. 10.

DESCRIPTION OF THE PREFERRED EMBODIMENTS

Figure 1:
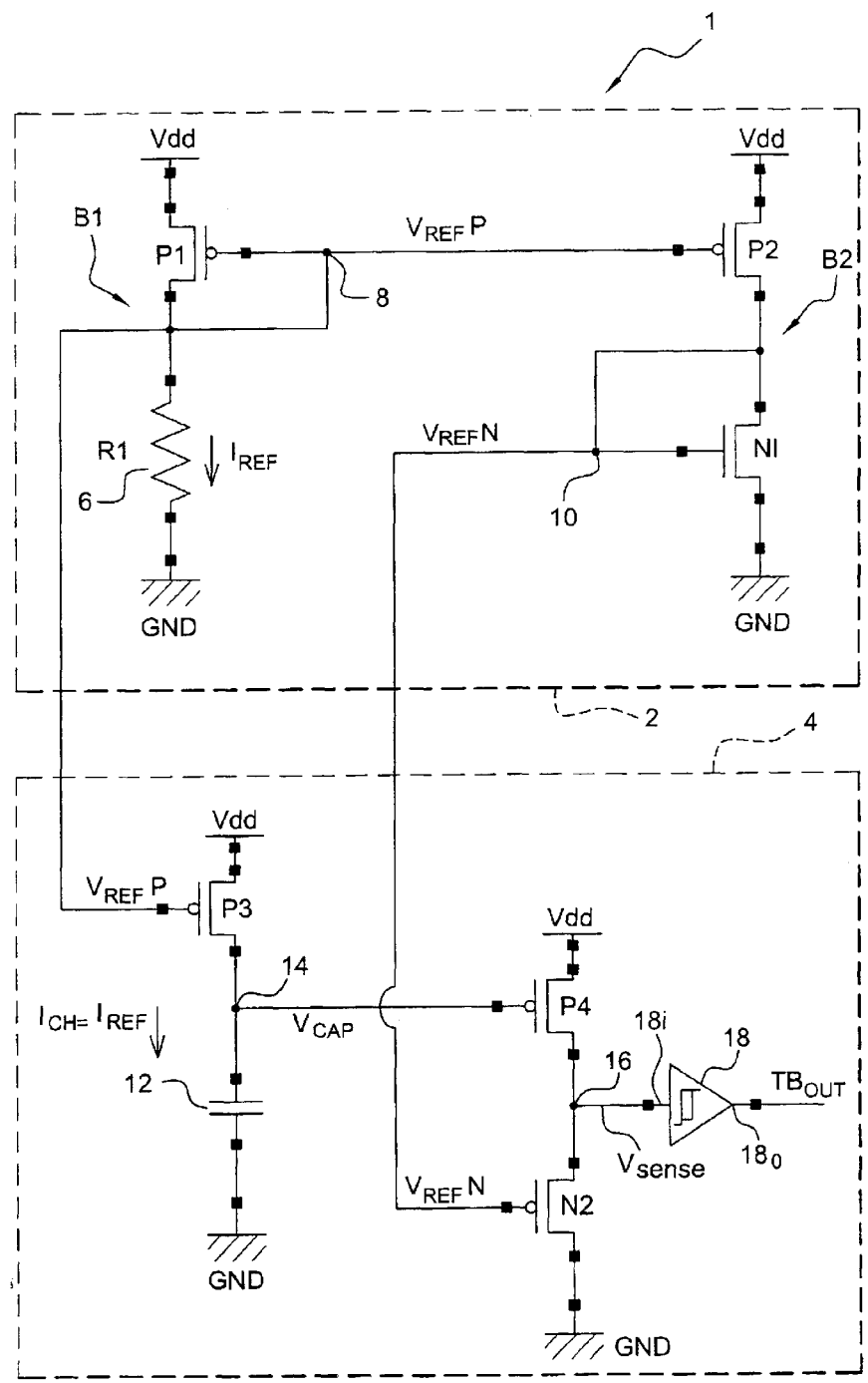
FIG. 1 is a circuit diagram of a time base circuit in accordance with a preferred embodiment of the invention.

The circuit diagram of the time base in accordance with a preferred embodiment of the present invention is shown in FIG. 1.

The time base circuit 1 preferably comprises two sections:
a MOS transistor current mirror circuit 2, framed in broken lines, at the top, and
a capacitor charging and charge detection circuit 4, framed in broken lines at the bottom.

The current mirror circuit 2 serves to produce first and second biasing control voltages, respectively $V_{REF}P$ and $V_{REF}N$ used in the capacitor charging and detection circuit 4, as shall be explained further.

The current mirror circuit 2 comprises first and second two back-to-back (common gate) PMOS transistors, respectively P1 and P2, each having their source connected to the main power supply voltage Vdd.

Transistor P1 is diode connected, with a direct connection between its drain and gate. The drain of transistor P1 is also connected to the first terminal of a resistor 6, of resistance R1, whose second terminal is connected to ground GND.

The drain of transistor P2 is connected to the drain of a first NMOS transistor N1, whose source is connected to ground. This transistor N1 is diode connected with a direct connection between its drain and gate.

The first biasing voltage $V_{REF}P$ is taken out from a node 8 that is common to the gates of transistors P1 and P2, and to the first terminal of resistor 6.

The second biasing voltage $V_{REF}N$ is taken out from a node 10 that is common to the drain and gate of transistor N1 and to the drain of transistor P2.

The current mirror circuit 2 can be considered as formed of two branches, each conveying the same current:

a first branch B1, composed of the serial connection of transistor P1 and resistor 6, which sets the value of the current conveyed, referred to as the reference current designated $I_{REF}$, and a second branch B2, composed of the serial connection of transistors P2 and N1, which mirrors the reference $I_{REF}$ and hence also conveys that current.

It will be observed that the control voltage $V_{REF}P$ at the first terminal of resistor 6 is fixed and equal to Vdd minus the voltage drop Vtp across transistor P1 (Vtp corresponds in effect to the threshold voltage of transistor P1).

From Ohm's law, the reference current $I_{REF}$ produced by the current mirror circuit 2 is given by:

$$I_{REF}=(V_{DD}-VtP)/R1 \quad (1)$$

The current flowing through resistor 6 is reproduced—mirrored—in the branch B2 by means of the control voltage $V_{REF}P$ on the gate of transistor P2. (Generally, $V_{REF}N$ applied to an NMOS transistor with its source to ground reproduces exactly the reference current $I_{REF}$.)

The capacitor charging and detection circuit 4 comprises a capacitor 12 of capacitance $C_{TB}$—referred to as the time base capacitor—whose charging to a determined voltage value Vdetect establishes the fundamental time interval $t_{TB}$ of the time base circuit. The time base capacitor 12 has a first terminal (plate) connected to the drain of a third PMOS transistor P3, the latter having its source connected to the supply voltage Vdd. The second terminal (plate) of capacitor 12 is connected to ground GND. The gate of PMOS transistor P3 is connected to node 8 of the current mirror circuit 2, so as to receive the first biasing control voltage $V_{REF}P$.

The common node 14 of transistor P3 and the time base capacitor (i.e. respectively the drain and the first terminal) is connected to the gate of fourth PMOS transistor P4. The latter has its source connected to the supply voltage Vdd and its drain connected to the drain of a second NMOS transistor N2, with which it is serially connected. This transistor N2 has its source connected to ground, and its gate connected to node 10 of the current mirror circuit 2, so as to receive the second biasing control voltage $V_{REF}N$. As will be detailed further, the serial connection of transistors P4 and N2 constitutes a voltage detection branch for determining when capacitor 12 has reached its determined detected charge voltage Vdetect.

The common node 16 of transistors P4 and N2 (i.e. their common drains) delivers a voltage $V_{sense}$ which signals when the time base capacitor 12 is charged to voltage Vdetect. This common node 16 is connected to the input terminal 18$i$ of an inverting type Schmitt trigger circuit 18. The latter is classically constructed from a simple transistor circuit or an operational amplifier to produce at its output 18$o$ logic level voltage swings between OV (corresponding to logic level 0) when $V_{sense}$ is at VDD or +5V, and a nominal voltage, e.g. +5V or VDD (corresponding to logic level 1) when that voltage $V_{sense}$ is at 0V (cf. FIG. 4).

The output 18$o$ produces the output signal $TB_{OUT}$ of the time base circuit 1, as shall be explained later.

The first to fourth PMOS transistors P1 to P4 are matched by having substantially the same design rules to produce the same electrical characteristics, and likewise the first and second NMOS transistors N1 and N2 are also matched for the same reasons. The matching can be advantageously achieved by ensuring, among other things, that the transistors in question have the same orientation, same environment and that they are located as close as possible in the wafer.

In operation, the first biasing control voltage $V_{REF}P$ applied to the gate of transistor P3 causes the latter to inject into the time base capacitor 12 a constant charging current $I_{CH}$ which is equal to the reference current $I_{REF}$ of the current mirror circuit 2. The capacitor 12 is considered to be charged to its detection voltage Vdetect when its first terminal attains Vdd−Vtp, i.e. the determined detected charge voltage Vdetect=Vdd−Vtp.

Initially, when the time base capacitor 12 is uncharged, its first terminal is substantially at ground voltage (OV). Between these extreme values (0V and Vdd−Vtp) the voltage at the capacitor's first terminal, designated $V_{CAP}$, increases linearly.

Given that the charge $Q_{TB}$ of the time base capacitor 12 is related:

i) to its capacitance $C_{TB}$ and the instantaneous voltage VCAP to which it is charged by:

$$Q_{TB}=C_{TB}\cdot V_{CAP}, \text{ and}$$

ii) to the capacitor charging current $I_{CH}$ (=$I_{REF}$) and charging time t by:

$$Q_{TB}=I_{CH}\cdot t,$$

it follows that $Q_{TB}=C_{TB}\cdot V_{CAP}=I_{CH}\cdot t$ (2)

The time $t_{TB}$ to charge capacitor 12 from zero volts to its determined charge voltage Vdetect=Vdd−Vtp thereby becomes:

$$t_{TB} = C_{TB} \cdot Vdetect / I_{CH} \quad (3)$$
$$= C_{TB} \cdot (Vdd - Vtp) \cdot R1/(Vdd - Vtp)$$

(substituting for $I_{CH}$ using relation (1) above), giving:

$$t_{TB}=C_{TB}\cdot R1 \quad (4)$$

Thus, the charging time $t_{TB}$ is made independent of the supply voltage Vdd and the possible variations of the transistor threshold voltages, and dependent only on two constants: the resistance R1 and the capacitance $C_{TB}$.

This condition is due to the combination of:

i) the manner in which the charging current $I_{CH}$ (and hence $I_{REF}$) is generated, and ii) the manner of setting the end of charging of the capacitor 12, made to correspond to the determined charge voltage Vdetect.

The presence of resistor 6 (value R1) in the relation can introduce a temperature dependency in the time constant $t_{TB}$. However, this dependency can, if required, be overcome or attenuated through various techniques, such as by using for resistor 6:

a component which exhibits a high stability with temperature, a combination of two or more resistors including at least one positive temperature coefficient resistor and at least one negative temperature coefficient resistor, connected and selected such that the overall resistance variations with temperature of the resistors tend to cancel each other out.

The detection of when the charge voltage $V_{CAP}$ of the time base capacitor 12 reaches the determined value Vdetect is effected by transistors P4 and N2 as follows.

When the time base capacitor 12 is initially uncharged, its voltage $V_{CAP}$ at node 14 is substantially zero, biasing transistor P4 to its conducting (ON) state (this transistor being of P-type). Accordingly, the input 18$i$ of the Schmitt trigger is substantially at Vdd.

For transistor P4, all the while the voltage $V_{CAP}$ at its gate is below Vdd−Vtp, the conducting (ON) state is maintained. Indeed, that transistor P4, being matched to transistor P3, has the same threshold value of Vtp. Also, under when in the ON state, P4 is "stronger" than N2 (in the sense that its carrying flow capacity is greater than the current imposed by transistor N2).

The moment when the capacitor 12 reaches the charging voltage Vdetect=Vdd−Vtp therefore coincides with the moment when transistor P4 becomes biased to its threshold voltage (i.e. when the potential difference between its gate and source falls to Vtp). And this is precisely the moment when that transistor P4 switches to the non-conducting (OFF) state.

Thus, the detected charge condition of the time base capacitor 12 is effectively flagged by the switching of transistor P4 to the non-conducting (OFF) state. This flag is relayed by the Schmitt trigger 18 to produce a concomitant voltage swing to the high level at its time base output $TB_{OUT}$ (The Schmitt trigger serves mainly to filter out noise on node 16.) Specifically, transistor N2 is maintained permanently biased at its gate to the second biasing control voltage $V_{REF}N$ such as to be conducting, but not in saturation. Its ON resistance $R_{ON}$ is thereby much higher than that of transistor P4 when the latter is conducting (ON), so that it can operate as a pull-down resistor only when transistor P4 is OFF (non-conducting). When transistor P4 is OFF, transistor N2 quickly pulls down the voltage at the Schmitt trigger input 18i to ground.

In this manner, the time base output $TB_{OUT}$ from the Schmitt trigger 18 produces a crisp logic signal starting from logic 0 all the while the time base capacitor 12 is being charged and swinging to logic 1 at the precise moment when the time base capacitor 12 has reached its charge to voltage level Vdetect.

Transistor N2 thus produces two technical effects:

i) it serves as a pull-down element draining a controlled current (governed by it bias voltage $V_{REFN}$). In this way, the above-mentioned voltage detection branch drains at the most the current produced by the current generator 2. Note that this voltage $V_{REFN}$ varies little with the power supply voltage Vdd; and ii) the current imposed by transistor N2 in the voltage detection branch enables to establish as the capacitor charge voltage detection level the voltage present at node 8 (i.e. at the gate and drain of current mirror P1), which is equal to Vdd−Vtp(=Vdetect).

It will be observed that since: i) the charging current $I_{CH}$ (=$I_{REF}$) is a function of the voltage Vdd−Vtp, and ii) the detected charge of the capacitor is detected at the specific voltage value Vdd−Vtp, then charged voltage cancels out from the expression for the charging time $t_{TB}$.

Figure 2:
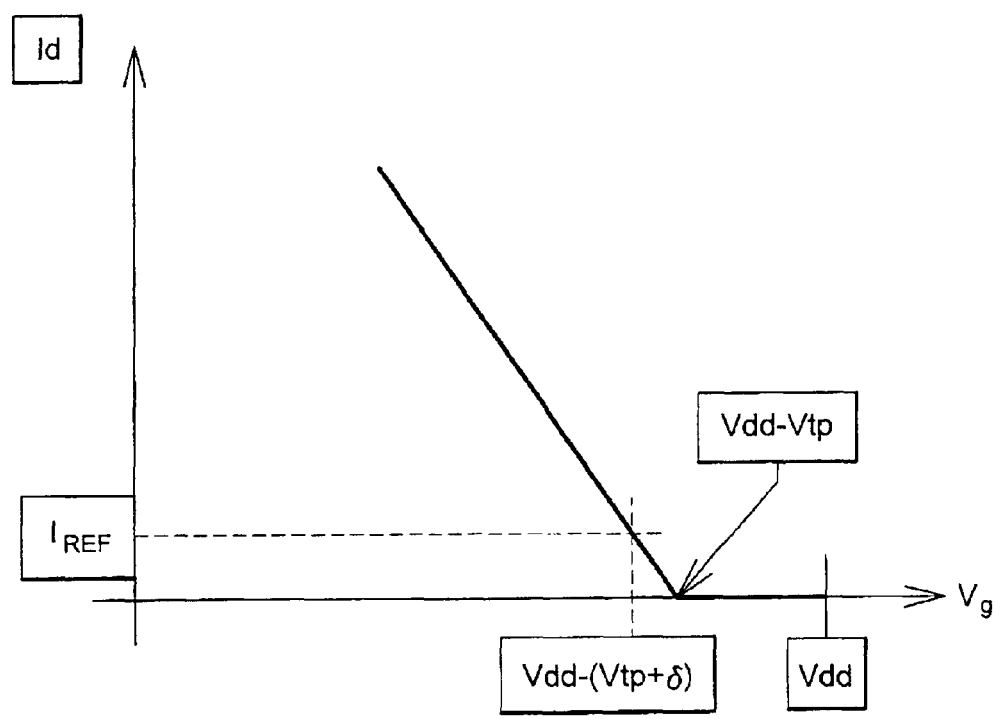
FIG. 2 shows an ideal slope of the drain current $I_D$=f(Vgate) characteristic for PMOS transistor used in the circuit of FIG. 1, with a source connected to VDD, showing the gate voltage biasing relative to a controlled constant current passing through that transistor.

The mechanism for detecting the end of charge condition of capacitor 12 is described here in more detail with reference to the graphs of FIGS. 2, 3 and 4.

FIG. 2 shows the drain current Id (ordinate) versus gate voltage Vg (abscissa) for PMOS transistors P1 or P2 of the current generator circuit 2.

The current Id (Id=f(Vg)) increases as Vg decreases and approaches OV.

The PMOS transistor exhibits the following conditions: for Vdd>Vg>Vdd−Vtp, Id=0.

Since the current mirrors of the current source circuit 2 produce a current $I_{REF}$, the biasing voltage Vg of the PMOS current source transistor is thus Vdd−(Vtp+δ'V). The term δV expresses a small but finite voltage sufficient to raise the transistor just above its exact switching threshold: at the exact threshold condition, the current Id is still 0. The value of δV is set arbitrarily to obtain the required value of Id.

By the mirror effect, the gate biasing conditions of the NMOS transistors N1 and N2 required to produce that same current $I_{REF}$ are given by:

Vg($I_{REF}$)=$V_{GND}$+(Vtn+δ'V), where $V_{GND}$ is the ground voltage, Vtn is NMOS transistor threshold voltage, and δ'V is the finite voltage for the particular design of the NMOS transistor in question, and which is normally different from the δV for the case of a PMOS transistor.

In the case considered, $V_{REFP}$=Vdd(Vtp+δV), and $V_{REFN}$=Vtn+δ'V.

The current through transistor N2 is simply the reference current $I_{REFN}$.

In the present time base circuit, the detection charging voltage Vdetect of the capacitor 12 to is more precisely:

Vdetect=Vdd−(Vtp+δV)(this definition is as for above, but taking account of the δV term).

In other words, in the example, by biasing transistor N2 at a gate voltage of $V_{REFN}$, the resulting current $I_{REFN}$ allows to detect the voltage level Vdetect.

The presence of $V_{REFN}$ on the gate of transistor N2 imposes a current $I_{REF}$ also on the voltage detection branch formed by transistors N2 and P4.

FIG. 3 shows in solid lines the current passing through the voltage detection branch (ordinate) i.e. transistors P4 and N2, as the voltage $V_{CAP}$ (abscissa) increases while the time base capacitor 12 is being charged. All the while transistor P4 is stronger, i.e. can pass the current imposed by transistor N2, this current is constant and equal to $I_{REF}$, i.e. the capacitor charging current, owing to biasing conditions of transistor N2 and characteristics of transistors P3 and N2.

FIG. 3 also shows in dotted lines the maximum current that transistor P4 can pass (i.e. its current if not controlled by transistor N2). That maximum current is governed by the voltage $V_{CAP}$ at its gate, and decreases linearly as that voltage increases with the charging of the capacitor 12. There arises a crossover point where this maximum possible current for transistor P4 falls to $I_{REF}$. At that point, the gate bias voltage of P4 is at Vdd−(Vtp+δV). From then on, transistor P4 is no longer able to pass the current $I_{REF}$, but a diminishing current determined by the slope of current maximum current of P4. From that crossover point, the electrical charge from P4 is thus pulled to ground by N2, and the voltage at the common note of P4 and N2 thereby drops quickly to 0V.

FIG. 4 shows, on a voltage axis (abscissa) aligned with that of FIG. 3, the evolution of the voltage $V_{sense}$ at the input 18i of the Schmitt trigger 18, i.e. the source voltage of the voltage detection transistor P4 as the capacitor voltage $V_{CAP}$ increases.

It can be observed that the voltage at the Schmitt trigger input 18i is maintained substantially at supply voltage Vdd all the while P4 can pass a current greater than or equal to the controlled current $I_{REF}$ of N2, and thereafter falls rapidly to 0V as mentioned above.

FIG. 5 shows the output $TB_{OUT}$ of the Schmitt trigger in response to the evolution $TB_{OUT}$. This output is made to be the logical inverse of the input voltage signal $V_{sense}$ of FIG. 4. Being of the inverting type, the output $TB_{out}$ is set to trigger by switching to the high logic state as soon as its input voltage Vsense drops below its triggering threshold, set just below about Vdd/2. As can be observed, the Schmitt trigger 18 provides sharp logic transition edges for improving the output waveform, e.g. in an oscillator application.

The current IP4 through transistor P4 decreases linearly as the capacitor 12 is being charged.

It will be observed that:

when the gate voltage Vg of transistor P4 is less than Vdd−(Vtp+δV), then IP4max>IN2: P4 is "stronger" than N2, whereupon the Schmitt trigger output $T_{BOUT}$ is at 0V (IP4max is the maximum current conveying capacity of transistor P4, and IN2 is the current imposed by transistor N2, i.e. $I_{REF}$);

when the gate voltage of P4 is equal to Vdetect, then IP4max=IN2=$I_{REF}$. This corresponds to the exact point of detection capacitor's ungrounded plate voltage;

when the gate voltage Vg of transistor P4 Vdetect=Vdd−(Vdd+δV), then IP4max<IN2. N2 is then "stronger" than P4, whereupon the node at the Schmitt trigger input 18$i$ (signal Vsense) tends to ground voltage;

when the gate voltage of P4 is greater than Vdd−Vtp, then IP4max=0, and N2 pulls the node at the Schmitt trigger input to ground.

From the foregoing, it can be understood that if there is imposed the condition IN2=Igen>$I_{REF}$ (where Igen is actual current passing though transistor P4), then the capacitor charge detection point, assimilated to the specified charge voltage Vdetect, shall be attained earlier, and while that capacitor is still charging. This can be followed from the graph of FIG. 3, by tracing a horizontal line corresponding to Igen, a vertical line at the point that the line of Igen intersects with IP4, and projecting that point onto the abscissa of FIG. 3 or 5. The point on the abscissa corresponds to the assimilated value of Vdetect for the value Igen.

Figure 6:
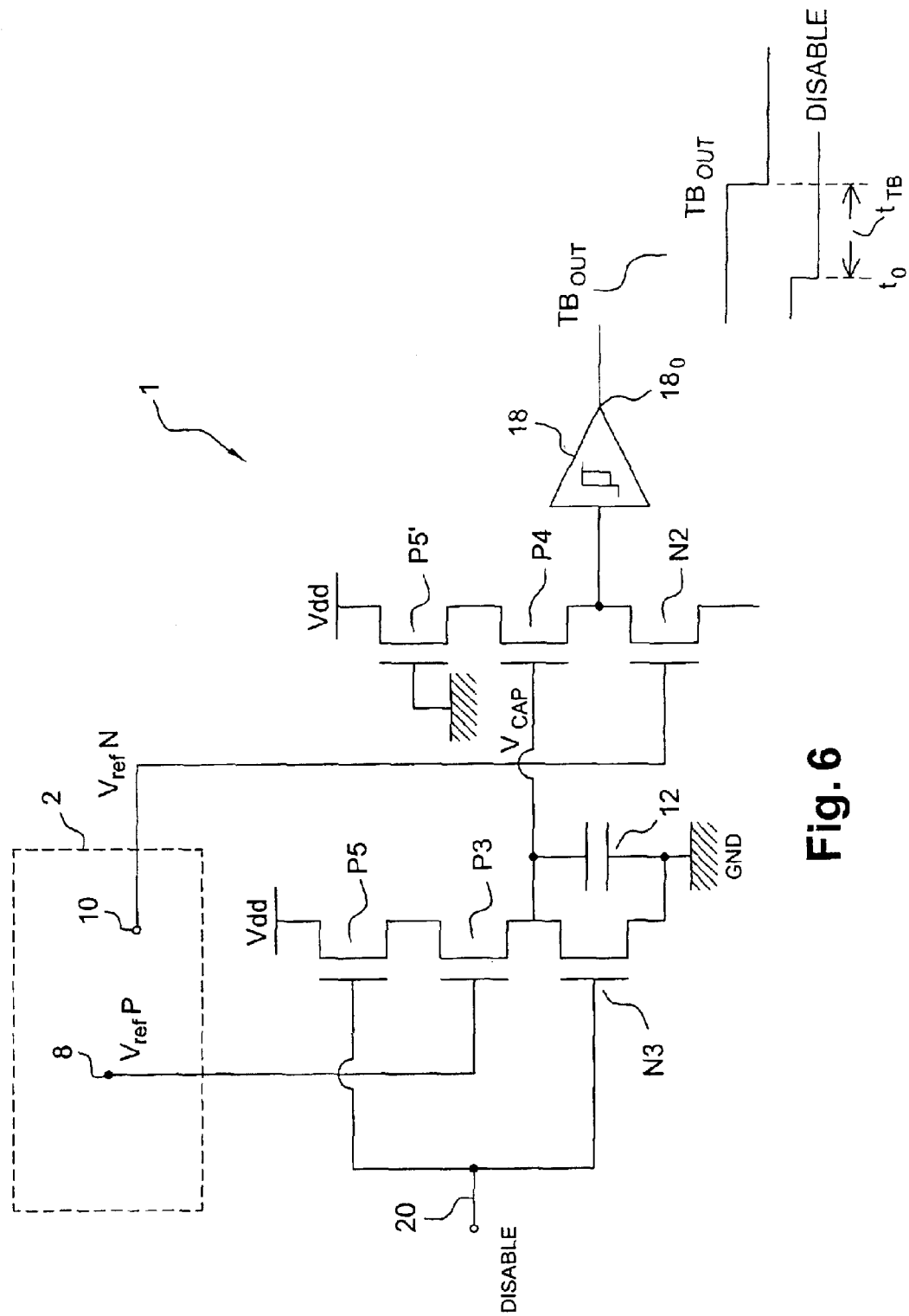
FIG. 6 is a circuit diagram of a variant of the time base circuit of FIG. 1, featuring an external control input for disabling and starting a time period measurement, and serving e.g. as a basis for a monostable-based oscillator circuit.

FIG. 6 is a circuit diagram of a variant of the first embodiment, that additionally provides a reset function, whereby the time base capacitor 12 can be discharged in response to a deactivation signal DISABLE. Accordingly, the time base circuit 1 can be automatically reactivated upon that deactivation signal being released, e.g. to constitute a monostable type of oscillator.

The circuit configuration is substantially the same as for the embodiment of FIG. 1, except that it further comprises three additional transistors at the level of its charge and detection circuit:

a fifth PMOS transistor P5 interposed between the third PMOS transistor P3 and the power supply Vdd, this transistor P5 having its source connected to Vdd and its drain connected to the source of transistor P3 to form a serial connection with the latter, a sixth PMOS transistor P5' having matched characteristics relative to the above fifth PMOS transistor, interposed between the fourth PMOS transistor P4 and the power supply Vdd, this transistor P5' having its gate connected to ground (to be permanently conducting when the power supply voltage Vdd is present), its source connected to Vdd and its drain connected to the source of transistor P4 to form a serial connection with the latter, and a third NMOS transistor N3 connected in parallel with the time base capacitor 12, its source being connected to ground GND and its drain being connected to the first terminal of that capacitor.

The gates of transistors P5 and N3 are interconnected and form a node 20 to which a DISABLE signal is applied. This signal is active at a high (logic level 1) voltage.

All the while this signal DISABLE is active, its positive potential simultaneously causes:

i) PMOS transistors P5 to be non-conducting (OFF), thereby isolating current generating transistor P3 from its power source Vdd, and hence interrupting the supply of charging current $I_{CH}$ to the time-base capacitor 12, and ii) NMOS transistor N3 to be conducting (ON), thereby creating a current conducting path for discharging the time base capacitor 12 to ground (bringing $V_{CAP}$ to 0V). (This path also serves to pull out any residual charge on the gate of transistor P4.)

Concerning point i) above, it will be observed that the operating conditions of transistor P3 enable the capacitor to charge virtually up to the supply voltage Vdd. This means that the circuit is in fact capable—if not prevented—of continuing to charge the capacitor 12 after the determined detection voltage level Vdetect, which defines the end of the time period. In the example considered, this voltage Vdetect can nevertheless be consisered as the "maximum" charge voltage since the capacitor is either prevented from being charged after that voltage by a timely reset through an activation of transistors N5 and N3 (cf. FIG. 7 or 8), or else any capacitor voltage above Vdetect is ignored.

By maintaining the DISABLE signal at logic 1 for at least the discharge time tdis of the capacitor 12 (e.g. from its charge voltage Vdetect), it can be ensured that the time-base circuit 1 shall be in a condition for measuring the time interval to charge from capacitor 12 from 0V to Vdetect, designated $t_{DB}$, as soon as that DISABLE signal is released.

To establish the time interval $t_{TB}$ from a given moment $t_0$, the DISABLE signal is simply set to its low voltage 0V (logic level 0), i.e. released, at that moment $t_0$. Transistor P5 will then be made conducting (ON), allowing transistor P3 to function and charge the time-base capacitor 12, and transistor N3 will at the same time $t_0$ be made non-conducting (OFF), so isolating the first terminal of the time base capacitor 12 from ground. In other words, the circuit 1 functions exactly as the circuit of FIG. 1 when the DISABLE signal is low. The output signal $TB_{OUT}$ from the Schmitt trigger output 18$o$ will then fall to zero after a time delay $t_{DB}$ starting from time $t_0$.

The presence of transistor P5' essentially serves to match the voltage characteristics of the voltage detection branch (the latter being composed of transistors P5', P4 and N2) as closely as possible to that of the capacitor charging branch (the latter being composed of transistors P5, P3 and N3). Specifically, any offset or other change in electrical characteristic caused by transistor P5 shall be reflected in exactly the same manner by transistor P5', whereupon the operating conditions described above with reference to time base circuit (FIGS. 1–5) shall be maintained.

Figure 7:
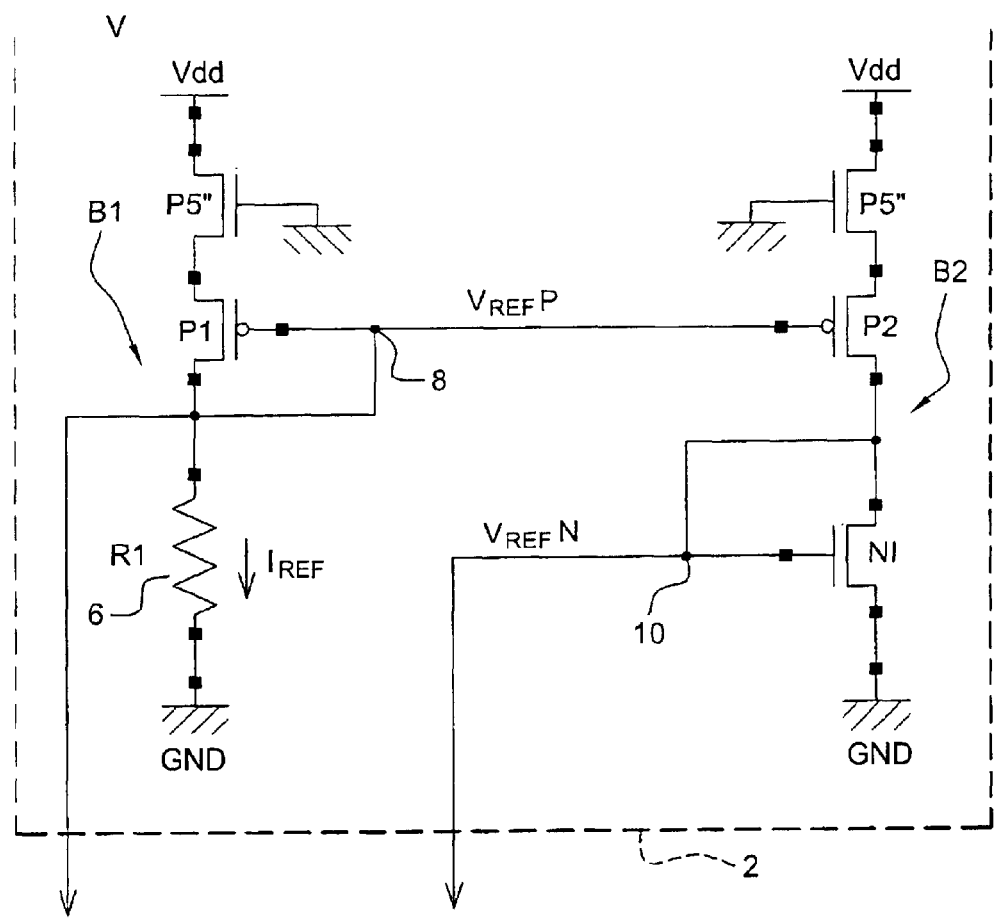
FIG. 7 is a circuit diagram of the current mirror circuit section of the circuit of FIG. 1, adapted by the provision of matching transistors for optimized operation with the circuit of FIG. 6.

FIG. 7 shows a modified form of the current mirror circuit portion 2 used with the circuit of FIG. 6 to ensure the branches providing the biasing voltages $V_{REFP}$ and $V_{REFN}$ are likewise matched in their characteristics to account for the presence of transistors P5 and P5'.

To this end, two identical transistors P5" are interposed respectively between transistor P1 and Vdd and between transistor P2 and Vdd, each transistor P5" having a drain connected to Vdd and a source connected to the drain of the transistor P1 or P2 with which it is interposed. The gates of the two transistors P5" are connected to ground, as in the case of transistor P5'.

In this way, the electrical characteristics of each of the current mirror branches, respectively formed of transistors P5", P1 and R1 and P5", P2 and N1, are likewise matched exactly to those of the respective capacitor charging and capacitor voltage detection branches to which transistors P5 and P5" have been added.

It will be understood that transistors P5' and P5" therefore constitute mutually matching transistors, also matching transistor P5.

The time base circuit 1 of FIG. 1 or 6 can form the basis of an oscillator, where time interval $t_{TB}$ defines a periodicity (mark and/or space) of the oscillating waveform.

There are numerous possibilities for such an oscillator implementation using standard techniques. A simple approach consists in constructing a monostable using the present time base circuit to establish the time period for the return to the stable state where the signal appearing at time $t_{TB}$ is used as a return to discharge the capacitor 12 and restart a charging cycle.

For instance, the signal $TB_{OUT}$ from the circuit of FIG. 6 can be arranged to generate a short DISABLE pulse signal to discharge the time base capacitor 12 and allow the time-base circuit 1 to restart. To this end, the Schmitt trigger output swing can be gated and fed back to the DISABLE signal input successively to disable the time base circuit, allow the time base capacitor to discharge and re-enable the time base circuit thereby to trigger a new cycle. This logic gating can be achieved by known logic techniques with a time delay to allow for the capacitor to discharge over the above-mentioned discharge period tdis.

In this way a cyclical, self-repeating operation is achieved with the $TB_{OUT}$ signal thereby being produced as a waveform.

Figure 8:
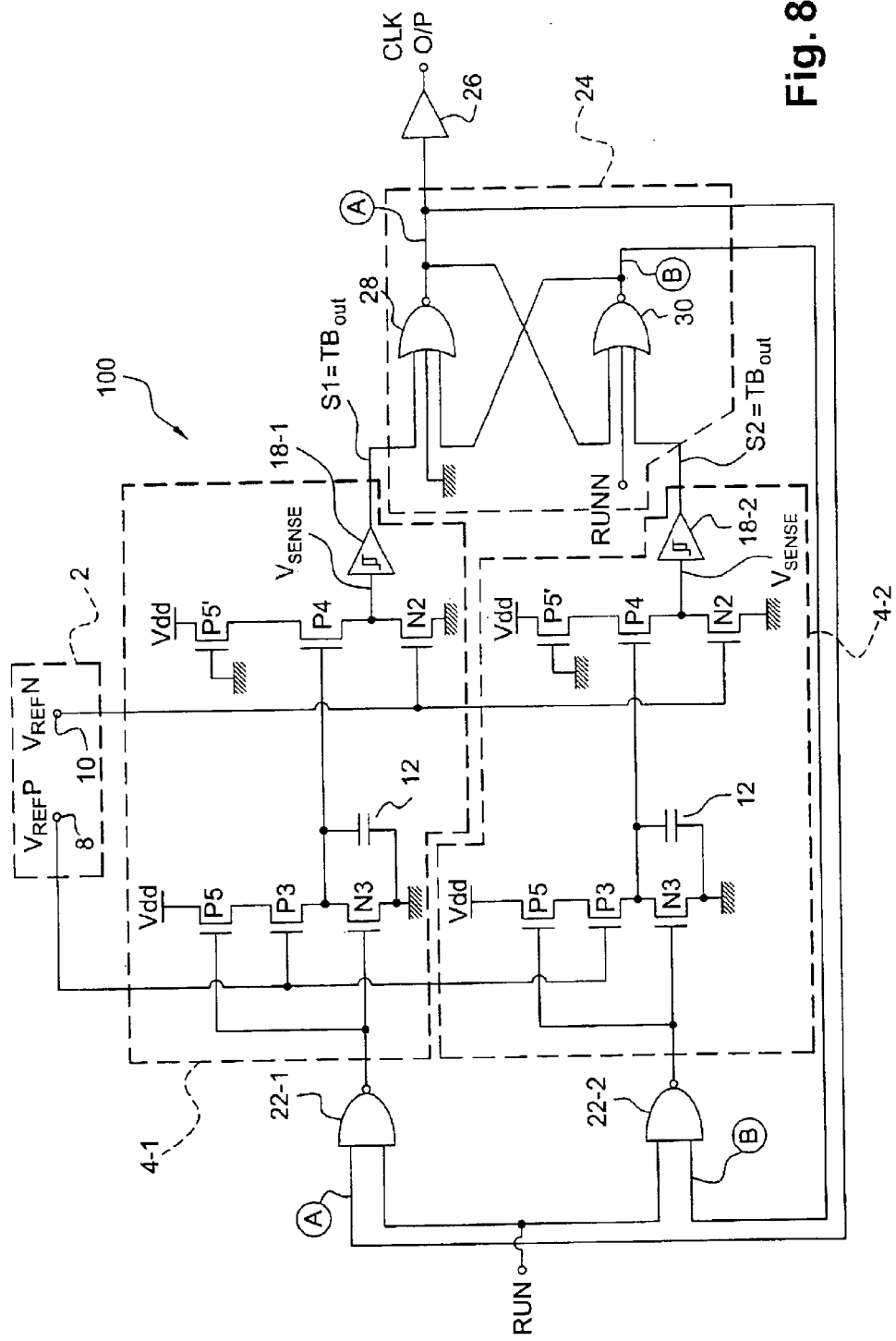
FIG. 8 is a circuit diagram of an oscillator according to a preferred embodiment of the invention, constructed on the basis of two time base circuits of the type shown in FIG. 1.

FIG. 8 is a circuit diagram of an oscillator circuit 100 constructed from two time base circuits, each one being the time base circuit 1 of FIG. 1, but additionally provided with the matching PMOS transistors P5, P5' as described with reference to FIG. 6. Also, the current mirror circuit 2 used in this oscillator circuit comprises the two matching transistors P5" as described with reference to FIG. 7.

The two time base circuits, designated first and second time base circuits 4-1 and 4-2, are arranged to operate in alternation to produce respective half-cycles of an output waveform CLK having a predetermined duty cycle. In the example, both time base circuits are set to have identical characteristics, so as to produce the output waveform CLK with a 50% duty cycle.

The parts and aspects of each of the first and second time base capacitor charging and charge detection circuits (hereafter abbreviated to "charge/detection circuit(s)") 4-1 and 4-2 that are substantially identical to circuit 4 of FIGS. 1 and 6 are identified by the same reference numerals and shall not be described again for conciseness, their previous description being integrated herein by reference to cover the present oscillator 100; only differences and additional circuit elements shall therefore be presented.

Each charge/detection circuit 4-1 and 4-2 thus comprises third, fourth, fifth and sixth PMOS transistors P3, P4, P5 and P5', second and third NMOS transistors N2 and N3, a time-base capacitor 12 and a Schmitt trigger, in the same configuration as in the circuit of FIG. 6. For both time charge/detection circuits 4-1 and 4-2, the gate of transistor P3 is connected to node 8 of the current mirror circuit 2 to receive biasing control voltage $V_{REF}P$, and the gate of transistor N2 is connected to node 10 of that current mirror circuit to receive biasing control voltage $V_{REF}N$. The current mirror circuit 2 is thus common to both time base circuits.

To be distinguishable, the two Schmitt triggers of the charge/detection circuits 4-1 and 4-2 are identified by reference numerals 18-1 and 18-2 respectively. For the same reasons, the time-base signals produced at the output of the Schmitt triggers 18-1 and 18-2 are designated S1 and S2.

For each of the time base circuits 4-1 and 4-2, the commonly-connected gates of transistors P5, and N3 are connected to an output of a respective two-input NAND gate, 22-1 and 22-2. Each NAND gate has a first input commonly connected to an input terminal for receiving a start signal RUN, active at logic level 1.

The second inputs of the NAND gates 22-1 and 22-2 each receive a respective return signal A and B from a combinational logic circuit 24. As shall detailed below, this circuit 24 effectively serves to switch over one time base circuit from a disable to a start state the moment the other has measured the time period $t_{TB}$, and vice versa, in self-repeating alternating cycles. The resulting oscillating waveform signal CLK is collected from an output of the combinational logic circuit, via a buffer amplifier 26.

The combinational logic circuit 24 is composed of first and second three-input NOR gates, respectively designated 28 and 30, configured as follows:

the first NOR gate 28 has a first input connected to the output S1 from the Schmitt trigger 18-1 of the first charge/detection circuit 4-1, a second input connected to the output of the second NOR gate 30, and a third input connected to ground; and the second NOR gate 30 has a first input connected to the output S2 from the Schmitt trigger 18-2 of the second charge/detection circuit 4-2, a second input connected to the output of the first NOR gate 28, and a third input for receiving a signal RUNN, which is the logical inverse of the RUN signal.

The output of the first NOR gate 28 is supplied to the buffer amplifier 26 to yield the oscillator output signal CLK.

The return signal A sent to the second input of NAND gate 22-1 is taken from the output of the first NOR gate 28. The return signal B sent to the second input of NAND gate 22-2 is taken from the output of the second NOR gate 30.

The control of the two time charge/detection circuits 4-1 and 4-2 by the combinational logic circuit 24 and NAND gates 22-1 and 22-2 is explained below with reference to the timing diagram of FIGS. 9a–9e.

The operation of the oscillator 100 is started by setting the signal RUN to logic 1. This logic state is typically present immediately upon power up of the circuit in which the oscillator is incorporated. For instance, if the oscillator is to be kept running all the while the circuit in which it is operating is powered, the RUN signal line can be soldered to the output of a power-up circuit which signals by a logic 1 voltage when the power supply voltage to which it is connected is above its acceptable minimum voltage value.

From that starting time, the output signal of the first Schmitt trigger 18-1 (point S1), is initially at logic 0 (FIG. 9a) and both capacitors 12 of the respective time base circuits 4-1 and 4-2 are uncharged. The cross-connection of NOR gates 28 and 30 ensures that their outputs A and B respectively are always at mutually opposite logic states.

Assuming that point A is initially at logic 1 (FIG. 9c), then the output of NAND gate 22-1 is at logic 0, causing transistors P5 and P3 to be ON and transistor N3 to be OFF at the first time base circuit 4-1. This enables the capacitor 12 of that time base to charge at constant current. All the while that capacitor has not reached its specified charging voltage Vdetect, the output of Schmitt trigger 18-1 remains at logic 0. Conversely, the output of NAND gate 22-2 associated to the second time base circuit 4-2 is forced to logic 1 (since both RUN and point B are at logic 1), whereupon transistors P5 and P3 are OFF and transistor N3 is ON, so preventing the charging of the capacitor for that time base and ensuring that its first terminal is connected to ground.

As soon as the capacitor of time base circuit 4-1 becomes charged to Vdetect, its Schmitt trigger output S1 jumps to logic 1 (FIG. 9a). This causes NOR gates 28 and 30 to change logic states in unison (FIGS. 9c and 9b respectively). Accordingly, in the first time base circuit 4-1, transistors P5 and P3 are switched OFF and transistor N3 is switched ON by NAND gate 22-1 being at logic 1 (owing to S1 being at logic 0). This causes the capacitor of that time base both to no longer receive a charging voltage and to have its charge drained away to ground through transistor N3, bringing the voltage at the gate of transistor P4 to 0V. The conductivity of transistor N3 is such as to discharge the capacitor in a period tdis which is short compared to the charging time (FIG. 9a).

At the same time, the logic 1 state at point B creates a logic 0 at the output of NAND gate 22-2, causing the second time base circuit 4-2 to charge its capacitor, exactly as for the first time base circuit 4-1 initially. Accordingly, the output of Schmitt trigger 18-2 shall switch to logic state 1 as soon as the voltage of that capacitor reaches Vdetect. This switch of logic state causes the logic states A and B to switch over once more, and hence to cause the first time base circuit 4-1 to begin again with a capacitor charging cycle while the second time base circuit 4-2 discharges its capacitor 12 through transistor N2 in the time tdis (FIG. 9d).

The cycles are self-repeating, through the alternating logic signals at gates 22-1, 22-2, 28 and 30, each time causing one of the time-base circuits to charge its capacitor while causing the other to discharge its capacitor and remain on standby, ready to charge as soon as the other time base circuit has charged its capacitor. The resulting oscillation thus has a time period equal the capacitor charging time.

It is clear that the oscillator output can also be taken from the output of NOR gate 30, by having the buffer 26 connected to receive that output instead. The choice of which gate 28 or 30 from which to take the oscillator output is interesting when a specific starting level is required: output from NOR gate 28 provides the oscillator starting initially in the high state, and output from NOR gate 30 provides the oscillator starting initially in the low state, the logic conditions for the RUN/RUNN signal being the same.

Note that the capacitor 12 in each of the time base circuits is charged with a constant controlled current, and discharged—much more quickly—without current control. This guarantees that before one charge/detection circuit has finished charging its capacitor, the capacitor of the other charge/detection circuit will have finished discharging and be reset, ready to charge at the next cycle, and vice-versa.

The RUN and RUNN inputs allow to set the return loop signal A and B in mutually opposite phases at the outset, with return signal A initially high. This feature solves the problem of establishing a stable and predictable starting point.

It will be noted that the oscillator according to the embodiment: i) always starts in the same manner (i.e. is consistent in the level and duration of the starting half period), and ii) produces a full first cycle (i.e. its initial output level has the duration of a full half-cycle period).

It is possible to produce duty cycles other than 50% simply by changing the time period of one time base circuit relative to the other, e.g. by playing on:

the value of resistor 6 (time period), and/or
the ratio of capacitance values of the capacitors 12 in the respective time base circuits 4-1 and 4-2 (duty cycle).

The above oscillator circuit 100 has many and diverse applications.

For instance, a shown in FIG. 10, it can be used as a built-in oscillator for a communicating chip which receives synchronous data via a so-called "single wire" protocol. By contrast with protocols based on two or more wires, where one wire serves to convey a clock signal, the single wire protocol has no dedicated clock input for synchronising the data input.

Accordingly, the data input has to be synchronized with an oscillator at the receiving end, i.e. within the chip, and whose oscillating signal is used just locally (i.e. not sent to the other communicating device(s). The oscillator must be always running in readiness to synchronize with unannounced input data. For this reason, the oscillator should preferably have low power consumption. A quick-starting capability of the oscillator is important to ensure that the circuit is operational with a stabilized frequency substantially as soon as it is powered.

As an example of a product application, the single-wire protocol circuit can constitute a peripheral that plugs into a communications device. The peripheral is intended to be recognized by the terminal and operational immediately the connection made, so as to function as a "hot" plug-and-play device.

The oscillator of FIG. 8 or an oscillator implemented by a monostable using a single time base-circuit as described with reference to FIG. 7, fulfils these requirements most advantageously.

For instance, FIG. 10 is a simplified block diagram of a plug-in apparatus, e.g. a memory device, connectable to a USB port, intended to be able to receive synchronised data from a main communicating apparatus 210, such as PC.

The plug-in apparatus has no power supply of its own, and is powered only when it is plugged in to the main communicating apparatus. In the example, the power supply is the voltage Vdd provided from a power supply 212 of the main apparatus through a supply line 214 leading to the USB communication port 216 to which the apparatus 200 is plugged in.

The plug-in apparatus 200 generates an internal data synchronising clock signal CLK using the oscillator circuit 100 of FIG. 8 (or another oscillator using the time base circuit of FIG. 1). The clock signal is supplied to a communication interface 102 of the plug-in apparatus to ensure that the latter can receive and send data synchronously with a main communication interface 218 of the main apparatus, but is not sent outside the apparatus 200.

As explained above, the oscillator 100 is able to deliver the first signal transition—forming an active clock edge—immediately after it is powered. In this way, the main communicating apparatus 210 can start to send data to the plug-in apparatus as from the instant the latter is plugged in, and have that data correctly received and identified.

An example of the relevant signals exchanged in this application is shown by the timing charts of FIGS. 11a to 11c.

FIG. 11a shows the voltage of the Vdd power supply terminal of the plug-in apparatus 200. Before it is plugged in to a power source, it remains at 0V, and jumps to Vdd the moment t0 when it is plugged into the USB of the main communicating apparatus.

From that moment, the output CLK of the oscillator 100 makes a transition from 0V to a voltage level (e.g. Vdd) that corresponds to a high clock signal. The duration of this initial high level is equal to the normal high level time period of the clock signal. In this way, the interval between the initial low-to-high transition to the following high-to-low transition is the same as for all other subsequent correspondingly-defined intervals. Accordingly, it is possible for the main communicating apparatus to send successfully its first bit of data (D1) during at that first time period.

Naturally, the synchronization of the data can be made on rising or falling edges as well as on logic levels. Also, it will be observed that should it be required to have instead the clock signal initially low during the first period, then this can be achieved simply by taking the (buffered) clock output from point B (output of NOR gate 30) rather than from point A (output of NOR gate 28).

Naturally, the USB port is cited just as an example of possible communication ports. It will be clear to skilled person that the above-described embodiments and variations thereof are amenable to modifications, substitutions and other equivalents without departing from the spirit of the invention or the scope of the claims.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method of establishing a time interval in terms of a time taken for a capacitor to charge from a reference voltage level to a detection voltage level, comprising:
   supplying at the start of the interval a capacitor charging current, using a first semiconductor device supplied from a first power supply voltage, the device delivering the charging current to the capacitor according to a predetermined dependency on the first power supply voltage; and
   identifying the detection voltage level to signal the end of the time interval, using a second semiconductor device supplied from the first power supply voltage, the second semiconductor device identifying the detection voltage level value according to the same predetermined dependency on the first power supply voltage as for the first semiconductor device, whereby the time interval is made substantially independent of variations of the first power supply voltage.

2. The method according to claim 1, wherein the predetermined dependency is a function of the difference between: i) a voltage supplied, from the first power supply voltage, to the first and second semiconductor devices, and ii) a threshold voltage of the first and second semiconductor devices.

3. The method according to claim 1, wherein the first and second semiconductor devices are matched transistors.

4. The method according to claim 1, wherein the first semiconductor device is a transistor having a control input biased by a biasing signal to deliver a constant current.

5. The method according to claim 1, wherein the second semiconductor device comprises a transistor placed in a current flow path passing a current substantially equal to the charging current while the capacitor is being charged.

6. The method according to claim 1, wherein the first and second semiconductor devices are placed in first and second current flow paths controlled to pass substantially the same current during the time interval.

7. The method according to claim 6, wherein the current flow in the first and second current flow paths is controlled by a control signal obtained from respective branches of a current mirror circuit.

8. The method according to claim 6, wherein the first and second current flow paths are controlled by a current mirror circuit formed by two current mirror transistors in respective current branches and connected as back-to-back transistors, a first current mirror transistor being connected in series with a resistive device to establish a reference current, and a second current mirror transistor being connected in series with a diode connected transistor, and wherein the first semiconductor device is a transistor biased by a signal taken from the common node of the back-to-back transistors and the current passing through the second semiconductor device is controlled by a transistor biased by the common node of the second current mirror transistor and the diode connected transistor.

9. The method according to claim 6, wherein the transistors of the current mirror circuit are MOS transistors.

10. The method according to claim 1, wherein the first and second semiconductor devices are MOS transistors, both MOS transistors having substantially equal threshold voltages and connected to a same power supply voltage.

11. The method according to claim 1, wherein the first and second semiconductor devices are PMOS transistors, both PMOS transistors having substantially equal threshold voltages and connected to a same positive power supply voltage.

12. The method according to claim 1, wherein the reference voltage is at ground potential and the detection voltage corresponds to the first power supply voltage, minus the threshold voltage of the first semiconductor device when in the conducting state.

13. The method according to claim 1, further comprising supplying a detection signal from the second semiconductor device, indicative of the detection of the detection voltage, to a Schmitt trigger set to deliver predetermined logic voltages as a function of the voltage value of the detection signal.

14. The method according to claim 1, wherein:
   the first semiconductor device is a first PMOS transistor having a source connected to the first power supply voltage, and a drain connected to a first terminal of the capacitor, the capacitor having a second terminal connected to the reference voltage;
   the second semiconductor device is a second PMOS transistor having a source connected to the first power supply voltage, and a drain connected to a drain of a first NMOS transistor, whose source connected to the reference voltage;
   the first PMOS transistor and the first NMOS transistor are biased at their gates by respective first and second voltage signals obtained from a current mirror circuit composed of two PMOS current mirror transistors in respective current branches and connected back-to-back by their gates, a first current mirror transistor being connected in series with a resistive device to establish a reference current, and a second current mirror transistor connected in series with a second NMOS transistor having its drain connected to its gate, the gate of the first PMOS transistor being biased by a signal taken from the common node of the back-to-back transistors, and the gate of the first NMOS transistor being biased by the common node of the second current mirror transistor and the drain of the second NMOS transistor.

15. A method of generating an oscillating signal having a periodicity established by establishing a time interval in terms of a time taken for a capacitor to charge from a reference voltage level to a detection voltage level, the method comprising:
   supplying at the start of the interval a capacitor charging current, using a first semiconductor device supplied from a first power supply voltage, the device delivering the charging current to the capacitor according to a predetermined dependency on the first power supply voltage;

identifying the detection voltage level to signal the end of the time interval, using a second semiconductor device supplied from the first power supply voltage, the second semiconductor device identifying the detection voltage level value according to the same predetermined dependency on the first power supply voltage as for the first semiconductor device, whereby the time interval is made substantially independent of the first power supply voltage;

discharging the capacitor to the reference voltage after the second semiconductor device identifies the detection voltage level; and repeating the supplying, identifying and discharging steps cyclically, and producing the oscillating signal on the basis of the corresponding cyclical detection of the detection voltage level.

16. The method according to claim 15, further comprising: extracting a response signal produced by the second semiconductor device in response to a detection of the detection voltage level, and using the response signal to establish the periodicity of the oscillating signal.

17. The method according to claim 16, further comprising: using the response signal to trigger logic levels changing in correspondence with the periodicity of the response signal, the triggered logic levels forming the oscillator output signal.

18. The method according to claim 15, further comprising: periodically blocking a supply of current to the capacitor by using a switching means in the current supply path at a given point between the first terminal of the capacitor and the first power supply voltage, the switching means being responsive to a periodic signal generated from the detection signal.

19. The method according to claim 15, further comprising: periodically discharging the capacitor by using a switchable capacitor discharging means that selectively connects the first terminal of the capacitor to the reference voltage to discharge the capacitor, the switchable capacitor discharging means being responsive to a periodic signal generated from the detection signal.

20. A method of generating an oscillating signal having a periodicity established by a time taken for a capacitor to charge from a reference voltage to a detection voltage level, the method comprising:

providing first and second time bases, each comprising:
means for supplying a capacitor with a charging current, comprising a first semiconductor device supplied from a first power supply voltage, the device delivering the charging current to the capacitor according to a predetermined dependency on the first power supply voltage,
means for identifying the detection voltage level to signal the end of the time interval, comprising a second semiconductor device supplied from the first power supply voltage, the second semiconductor device identifying the detection voltage level value according to the same predetermined dependency on the first power supply voltage as for the first semiconductor device, whereby the time interval is made substantially independent of the first power supply voltage, and
means for discharging the capacitor to the reference voltage after the second semiconductor device identifies the detection voltage level;

causing the first and second time bases to operate in alternation by initially starting the charging of the capacitor of the first time base, and cyclically using the detection of the detection voltage of the first time base to both start the charging of the capacitor of the second time base and to discharge the capacitor of the first time base;

using the detection of the detection voltage of the second time base to both start the charging of the capacitor of the first time base and to discharge the capacitor of the second time base; and using the resulting cyclic detection of a detection voltage at one or both time bases as a time base to produce the oscillating signal.

21. A method of generating an oscillating signal having a periodicity established by a time taken for a capacitor to charge from a reference voltage to a detection voltage level, comprising:

providing first and second time bases, each comprising:
means for supplying a capacitor with a charging current, comprising a first semiconductor device supplied from a first power supply voltage, the device delivering the charging current to the capacitor according to a predetermined dependency on the first power supply voltage,
means for identifying the detection voltage level to signal the end of the time interval, comprising a second semiconductor device supplied from the first power supply voltage, the second semiconductor device identifying the detection voltage level value according to the same predetermined dependency on the first power supply voltage as for the first semiconductor device, whereby the time interval is made substantially independent of the first power supply voltage, and
means for discharging the capacitor to the reference voltage after the second semiconductor device identifies the detection voltage level; and performing cyclical steps a) to d) below:
a) charging the capacitor of the first time base through the first semiconductor device thereof,
b) in response to the second semiconductor device of the first time base signalling the detection of the detection voltage value, charging the capacitor of the second time base through the first semiconductor device of the second time base,
c) discharging the capacitor of the first time base to the reference voltage while the capacitor of the second time base is being charged,
d) in response to the second semiconductor device of the second time base signalling the detection of the detection voltage value, returning to cyclical step a) and discharging the capacitor of the second time base prior to cyclical step b),
thereby producing the oscillating signal on the basis of the cyclical alternation of detecting the detection voltage by the first and/or the second time base(s).

22. The method according to claim 21, further comprising the step of providing logic gating circuit means for causing the detection of the detection voltage by the first time base to trigger cyclical steps b) and c), and for causing the detection of the detection voltage by the second time base to trigger cyclical step d) and, after a first cycle, cyclical step a).

23. The method according to claim 21, further comprising the steps of providing switching means at each of the first and second time bases, in the first current path, the switching means of the first time base being responsive to a detection of the detection voltage by the second time base for preventing a supply of current to the capacitor of the first time base, and the switching means of the second time base being responsive to a detection of the detection voltage by the first time base for preventing a supply of current to the capacitor of the second time base.

24. The method according to claim 21, further comprising, selectively connecting the first terminal of a respective capacitor to the reference voltage to discharge the capacitor for each of the first and second time bases, by a switchable capacitor discharging means, the switchable capacitor discharging means of the first time base being responsive to a detection of the detection voltage by the second semiconductor device of the first time base to connect the first terminal of the capacitor of the first time base plate to the reference voltage, and the switchable capacitor discharging means of the second time base being responsive to a detection of the detection voltage by the second semiconductor device of the second time base to connect the first terminal of the capacitor of the second time base plate to the reference voltage.

25. A device for establishing a time interval in terms of a time taken for a capacitor to charge from a reference voltage level to a detection voltage level, comprising:

means for supplying at the start of the interval a capacitor charging current, comprising a first semiconductor device supplied from a first power supply voltage, the device delivering the charging current to the capacitor according to a predetermined dependency on the first power supply voltage; and means for identifying the detection voltage level to signal the end of the time interval, comprising a second semiconductor device supplied from the first power supply voltage, the second semiconductor device identifying the detection voltage level value according to the same predetermined dependency on the first power supply voltage as for the first semiconductor device, whereby the time interval is made substantially independent of variations of the first power supply voltage.

26. The device according to claim 25, wherein the predetermined dependency is a function of the difference between: i) a voltage supplied, from the first power supply voltage, to the first and second semiconductor devices, and ii) a threshold voltage of the first and second semiconductor devices.

27. The device according to claim 25, wherein the first and second semiconductor devices are matched transistors.

28. The device according to claim 25, wherein the first semiconductor device is a transistor having a control input biased by a biasing signal to deliver a constant current.

29. The device according to claim 25, wherein the second semiconductor device comprises a transistor placed in a current flow path controllable to pass a current substantially equal to the charging current while the capacitor is being charged.

30. The device according to claim 25, wherein the first and second semiconductor devices are placed in first and second current flow paths controllable to pass substantially the same current during the time interval.

31. The device according to claim 30, wherein the current flow in the first and second current flow paths is controllable by a control signal obtained from respective branches of a current mirror circuit.

32. The device according to claim 30, wherein the first and second current flow paths are controllable by a current mirror circuit formed by two current mirror transistors in respective current branches and connected as back-to-back transistors, a first current mirror transistor being connected in series with a resistive device to establish a reference current, and a second current mirror transistor being connected in series with a diode connected transistor, and wherein the first semiconductor device is a transistor biased by a signal taken from the common node of the back-to-back transistors and the current passing through the second semiconductor device is controlled by a transistor biased by the common node of the second current mirror transistor and the diode connected transistor.

33. The device according to claim 32, wherein the transistors of the current mirror circuit are MOS transistors.

34. The device according to claim 25, wherein the first and second semiconductor devices are MOS transistors, both MOS transistors having substantially equal threshold voltages and connected to a same power supply voltage.

35. The device according to claim 25, wherein the first and second semiconductor devices are PMOS transistors, both PMOS transistors having substantially equal threshold voltages and connected to a same positive power supply voltage.

36. The device according to claim 25, wherein the reference voltage is at ground potential and the detection voltage corresponds to the first power supply voltage, minus the threshold voltage of the first semiconductor device when in a conducting state.

37. The device according to claim 25, further comprising means for supplying a detection signal from the second semiconductor device, indicative of the detection of the detection voltage, to a Schmitt trigger set to deliver predetermined logic voltages as a function of the voltage value of the detection signal.

38. The device according to claim 25, wherein:

the first semiconductor device is a first PMOS transistor having a source connected to the first power supply voltage, and a drain connected to a first terminal of the capacitor, the capacitor having a second terminal connected to the reference voltage;

the second semiconductor device is a second PMOS transistor having a source connected to the first power supply voltage, and a drain connected to a drain of a first NMOS transistor, whose source connected to the reference voltage;

the first PMOS transistor and the first NMOS transistor are biased at their gates by respective first and second voltage signals obtained from a current mirror circuit composed of two PMOS current mirror transistors in respective current branches and connected back-to-back by their gates, a first current mirror transistor being connected in series with a resistive device to establish a reference current, and a second current mirror transistor connected in series with a second NMOS transistor having its drain connected to its gate, the gate of the first PMOS transistor being biased by a signal taken from the common node of the back-to-back transistors, and the gate of the first NMOS transistor being biased by the common node of the second current mirror transistor and the drain of the second NMOS transistor.

39. A device for generating an oscillating signal having a periodicity established by establishing a time interval in terms of a time taken for a capacitor to charge from a reference voltage level to a detection voltage level, comprising:

means for supplying at the start of the interval a capacitor charging current, using a first semiconductor device supplied from a first power supply voltage, the device delivering the charging current to the capacitor according to a predetermined dependency on the first power supply voltage;

means for identifying the detection voltage level to signal the end of the time interval, using a second semiconductor device supplied from the first power supply voltage, the second semiconductor device identifying the detection voltage level value according to the same predetermined dependency on the first power supply voltage as for the first semiconductor device, whereby the time interval is made substantially independent of the first power supply voltage;

means for discharging the capacitor to reference voltage after the second semiconductor device identifies the detection voltage level; and means for cyclically operating the means for supplying, means for identifying, and means for discharging, to produce the oscillating signal on the basis of the corresponding cyclical detection of the detection voltage level.

40. The device according to claim 39, further comprising means for extracting a response signal produced by the second semiconductor device in response to a detection of the detection voltage level, and means for using the response signal to establish the periodicity of the oscillator output signal.

41. The device according to claim 39, further comprising means for using the response signal to trigger logic levels changing in correspondence with the periodicity of the response signal, the triggered logic levels forming a clock signal.

42. The device according to claim 39, further comprising switching means in the current supply path at a given point between the first terminal of the capacitor and the first power supply voltage, the switching means being responsive to a periodic signal generated from the detection signal for periodically blocking a supply of current to the capacitor.

43. The device according to claim 39, further comprising switchable capacitor discharging means for selectively connecting the first terminal of the capacitor to the reference voltage to discharge the capacitor, the switchable capacitor discharging means being responsive to a periodic signal generated from the detection signal for periodically discharging the capacitor.

44. A device for generating an oscillating signal having a periodicity established by a time taken for a capacitor to charge from a reference voltage to a detection voltage level, comprising:

first and second time bases, each comprising:

means for supplying a capacitor with a charging current, comprising a first semiconductor device supplied from a first power supply voltage, the device delivering the charging current to the capacitor according to a predetermined dependency on the first power supply voltage, means for identifying the detection voltage level to signal the end of the time interval, comprising a second semiconductor device supplied from the first power supply voltage, the second semiconductor device identifying the detection voltage level value according to the same predetermined dependency on the first power supply voltage as for the first semiconductor device, whereby the time interval is made substantially independent of the first power supply voltage, and means for discharging the capacitor to the reference voltage after the second semiconductor device identifies the detection voltage level; and control means for causing the first and second time bases to operate in alternation by initially starting the charging of the capacitor of the first time base, the control means being operative for cyclically:

using the detection of the detection voltage of the first time base to both start the charging of the capacitor of the second time base and to discharge the capacitor of the first time base, and using the detection of the detection voltage of the second time base to both start the charging of the capacitor of the first time base and to discharge the capacitor of the second time base; and means responsive to the resulting cyclic detection of a detection voltage at one or both time bases as a time base to produce the oscillating signal.

45. A device for generating an oscillating signal having a periodicity established by a time taken for a capacitor to charge from a reference voltage to a detection voltage level, comprising:

first and second time bases, each comprising:

means for supplying a capacitor with a charging current, comprising a first semiconductor device supplied from a first power supply voltage, the device delivering the charging current to the capacitor according to a predetermined dependency on the first power supply voltage;

means for identifying the detection voltage level to signal the end of the time interval, comprising a second semiconductor device supplied from the first power supply voltage, the second semiconductor device identifying the detection voltage level value according to the same predetermined dependency on the first power supply voltage as for the first semiconductor device, whereby the time interval is made substantially independent of the first power supply voltage; and means for discharging the capacitor to the reference voltage after the second semiconductor device identifies the detection voltage level; and means for performing cyclical steps a) to d) below:

a) charging the capacitor of the first time base through the first semiconductor device thereof;

b) in response to the second semiconductor device of the first time base signalling the detection of the detection voltage value, charging the capacitor of the second time base through the first semiconductor device of the second time base;

c) discharging the capacitor of the first time base to the reference voltage while the capacitor of the second time base is being charged; and d) in response to the second semiconductor device of the second time base signalling the detection of the detection voltage value, returning to cyclical step a) and discharging the capacitor of the second time base prior to cyclical step b), thereby producing the oscillating signal on the basis of the cyclical alternation detecting the detection voltage by the first and/or the second time base(s).

46. The device according to claim 45, further comprising the step of providing logic gating circuit means for causing the detection of the detection voltage by the first time base to trigger cyclical steps b) and c), and for causing the detection of the detection voltage by the second time base to trigger cyclical step d) and, after a first cycle, cyclical step a).

47. The device according to claim 46, further comprising switching means at each of the first and second time bases, in the first current path, the switching means of the first time base being responsive to a detection of the detection voltage by the second time base for preventing a supply of current to the capacitor of the first time base, and the switching means of the second time base being responsive to a detection of the detection voltage by the first time base for preventing a supply of current to the capacitor of the second time base.

48. The device according to claim 47, further comprising, for each of the first and second time bases, switchable capacitor discharging means for selectively connecting the first terminal of a respective the capacitor to the reference voltage to discharge the capacitor, the switchable capacitor discharging means of the first time base being responsive to a detection of the detection voltage by the second semiconductor device of the first time base to connect the first terminal of the capacitor of the first time base plate to the reference voltage, and the switchable capacitor discharging means of the second time base being responsive to a detection of the detection voltage by the second semiconductor device of the second time base to connect the first terminal of the capacitor of the second time base plate to the reference voltage.

49. An oscillator for generating an oscillating signal waveform substantially immediately after supplying power to the oscillator, comprising:

a time base circuit for establishing a time interval in terms of a time taken for a capacitor to charge from a reference voltage level to a detection voltage level, the time base circuit comprising:

means for supplying at the start of the interval a capacitor charging current, comprising a first semiconductor device supplied from a first power supply voltage, the device delivering the charging current to the capacitor according to a predetermined dependency on the first power supply voltage; and means for identifying the detection voltage level to signal the end of the time interval, comprising a second semiconductor device supplied from the first power supply voltage, the second semiconductor device identifying the detection voltage level value according to the same predetermined dependency on the first power supply voltage as for the first semiconductor device, whereby the time interval is made substantially independent of variations of the first power supply voltage, and wherein an initial half wave of a waveform generated by the oscillator starting substantially at a normal point in the phase of the waveform, the initial half wave having a duration substantially equal to a cycle period of the waveform.

50. An oscillator for generating an oscillating signal waveform substantially immediately after supplying power to the oscillator, comprising:

a time base circuit for generating an oscillating signal having a periodicity established by establishing a time interval in terms of a time taken for a capacitor to charge from a reference voltage level to a detection voltage level, the time base circuit comprising:

means for supplying at the start of the interval a capacitor charging current, using a first semiconductor device supplied from a first power supply voltage, the device delivering the charging current to the capacitor according to a predetermined dependency on the first power supply voltage;

means for identifying the detection voltage level to signal the end of the time interval, using a second semiconductor device supplied from the first power supply voltage, the second semiconductor device identifying the detection voltage level value according to the same predetermined dependency on the first power supply voltage as for the first semiconductor device, whereby the time interval is made substantially independent of the first power supply voltage;

means for discharging the capacitor to reference voltage after the second semiconductor device identifies the detection voltage level; and means for cyclically operating the means for supplying, means for identifying, and means for discharging, to produce the oscillating signal on the basis of the corresponding cyclical detection of the detection voltage level, and wherein an initial half wave of a waveform generated by the oscillator starting substantially at a normal point in the phase of the waveform, the initial half wave having a duration substantially equal to a cycle period of the waveform.

51. An oscillator for generating an oscillating signal waveform substantially immediately after supplying power to the oscillator, comprising:

a time base circuit for generating an oscillating signal having a periodicity established by a time taken for a capacitor to charge from a reference voltage to a detection voltage level, the time base circuit comprising:

first and second time bases, each comprising:

means for supplying a capacitor with a charging current, comprising a first semiconductor device supplied from a first power supply voltage, the device delivering the charging current to the capacitor according to a predetermined dependency on the first power supply voltage, means for identifying the detection voltage level to signal the end of the time interval, comprising a second semiconductor device supplied from the first power supply voltage, the second semiconductor device identifying the detection voltage level value according to the same predetermined dependency on the first power supply voltage as for the first semiconductor device, whereby the time interval is made substantially independent of the first power supply voltage, and means for discharging the capacitor to the reference voltage after the second semiconductor device identifies the detection voltage level; and control means for causing the first and second time bases to operate in alternation by initially starting the charging of the capacitor of the first time base, the control means being operative for cyclically:

using the detection of the detection voltage of the first time base to both start the charging of the capacitor of the second time base and to discharge the capacitor of the first time base, and using the detection of the detection voltage of the second time base to both start the charging of the capacitor of the first time base and to discharge the capacitor of the second time base; and means responsive to the resulting cyclic detection of a detection voltage at one or both time bases as a time base to produce the oscillating signal, and wherein an initial half wave of a waveform generated by the oscillator starting substantially at a normal point in the phase of the waveform, the initial half wave having a duration substantially equal to a cycle period of the waveform.

52. An oscillator for generating an oscillating signal waveform substantially immediately after supplying power to the oscillator, comprising:

a time base circuit for generating an oscillating signal having a periodicity established by a time taken for a capacitor to charge from a reference voltage to a detection voltage level, the time base circuit comprising:

first and second time bases, each comprising:
means for supplying a capacitor with a charging current, comprising a first semiconductor device supplied from a first power supply voltage, the device delivering the charging current to the capacitor according to a predetermined dependency on the first power supply voltage;
means for identifying the detection voltage level to signal the end of the time interval, comprising a second semiconductor device supplied from the first power supply voltage, the second semiconductor device identifying the detection voltage level value according to the same predetermined dependency on the first power supply voltage as for the first semiconductor device, whereby the time interval is made substantially independent of the first power supply voltage; and
means for discharging the capacitor to the reference voltage after the second semiconductor device identifies the detection voltage level; and means for performing cyclical steps a) to d) below:
a) charging the capacitor of the first time base through the first semiconductor device thereof;
b) in response to the second semiconductor device of the first time base signalling the detection of the detection voltage value, charging the capacitor of the second time base through the first semiconductor device of the second time base;
c) discharging the capacitor of the first time base to the reference voltage while the capacitor of the second time base is being charged; and
d) in response to the second semiconductor device of the second time base signalling the detection of the detection voltage value, returning to cyclical step a) and discharging the capacitor of the second time base prior to cyclical step b), thereby producing the oscillating signal on the basis of the cyclical alternation detecting the detection voltage by the first and/or the second time base(s), and wherein an initial half wave of a waveform generated by the oscillator starting substantially at a normal point in the phase of the waveform, the initial half wave having a duration substantially equal to a cycle period of the waveform.

53. An apparatus comprising:
an interface that can be coupled with a second apparatus to exchange therewith data at a data rate according to an oscillating frequency of an oscillating signal waveform;

an oscillator, coupled with the interface, for generating the oscillating signal waveform substantially immediately after power is supplied to the oscillator; and a time base circuit, coupled with the oscillator, for establishing a time interval in terms of a time taken for a capacitor to charge from a reference voltage level to a detection voltage level, the time base circuit comprising:

means for supplying at the start of the interval a capacitor charging current, comprising a first semiconductor device supplied from a first power supply voltage, the device delivering the charging current to the capacitor according to a predetermined dependency on the first power supply voltage; and means for identifying the detection voltage level to signal the end of the time interval, comprising a second semiconductor device supplied from the first power supply voltage, the second semiconductor device identifying the detection voltage level value according to the same predetermined dependency on the first power supply voltage as for the first semiconductor device, whereby the time interval is made substantially independent of variations of the first power supply voltage, and wherein the apparatus, substantially immediately after being coupled with the second apparatus and receiving power, exchanges with the second apparatus data at a data rate according to the oscillating frequency of the oscillating signal waveform generated from the oscillator.

54. The apparatus of claim 53, wherein the oscillator receives power from the second apparatus via the interface, and wherein the apparatus, substantially immediately upon being coupled to the second apparatus via the interface exchanges with the second apparatus data at a data rate according to the oscillating frequency of the oscillating signal waveform generated from the oscillator.

55. An apparatus comprising:
an interface that can be coupled with a second apparatus to exchange therewith data at a data rate according to an oscillating frequency of an oscillating signal waveform;

an oscillator, coupled with the interface, for generating the oscillating signal waveform substantially immediately after power is supplied to the oscillator; and a time base circuit, coupled with the oscillator, for establishing a time interval in terms of a time taken for a capacitor to charge from a reference voltage level to a detection voltage level, the time base circuit comprising:

means for supplying at the start of the interval a capacitor charging current, using a first semiconductor device supplied from a first power supply voltage, the device delivering the charging current to the capacitor according to a predetermined dependency on the first power supply voltage;

means for identifying the detection voltage level to signal the end of the time interval, using a second semiconductor device supplied from the first power supply voltage, the second semiconductor device identifying the detection voltage level value according to the same predetermined dependency on the first power supply voltage as for the first semiconductor device, whereby the time interval is made substantially independent of the first power supply voltage;

means for discharging the capacitor to reference voltage after the second semiconductor device identifies the detection voltage level; and means for cyclically operating the means for supplying, means for identifying, and means for discharging, to produce the oscillating signal on the basis of the corresponding cyclical detection of the detection voltage level, and wherein the apparatus, substantially immediately after being coupled with the second apparatus and receiving power, exchanges with the second apparatus data at a data rate according to the oscillating frequency of the oscillating signal waveform generated from the oscillator.

56. The apparatus of claim 55, wherein the oscillator receives power from the second apparatus via the interface, and wherein the apparatus, substantially immediately upon being coupled to the second apparatus via the interface exchanges with the second apparatus data at a data rate according to the oscillating frequency of the oscillating signal waveform generated from the oscillator.

57. An apparatus comprising:
an interface that can be coupled with a second apparatus to exchange therewith data at a data rate according to an oscillating frequency of an oscillating signal waveform;
an oscillator, coupled with the interface, for generating the oscillating signal waveform substantially immediately after power is supplied to the oscillator; and
a time base circuit, coupled with the oscillator, for establishing a time interval in terms of a time taken for a capacitor to charge from a reference voltage level to a detection voltage level, the time base circuit comprising:
first and second time bases, each comprising:
means for supplying a capacitor with a charging current, comprising a first semiconductor device supplied from a first power supply voltage, the device delivering the charging current to the capacitor according to a predetermined dependency on the first power supply voltage,
means for identifying the detection voltage level to signal the end of the time interval, comprising a second semiconductor device supplied from the first power supply voltage, the second semiconductor device identifying the detection voltage level value according to the same predetermined dependency on the first power supply voltage as for the first semiconductor device, whereby the time interval is made substantially independent of the first power supply voltage, and
means for discharging the capacitor to the reference voltage after the second semiconductor device identifies the detection voltage level; and
control means for causing the first and second time bases to operate in alternation by initially starting the charging of the capacitor of the first time base, the control means being operative for cyclically:
using the detection of the detection voltage of the first time base to both start the charging of the capacitor of the second time base and to discharge the capacitor of the first time base, and
using the detection of the detection voltage of the second time base to both start the charging of the capacitor of the first time base and to discharge the capacitor of the second time base; and
means responsive to the resulting cyclic detection of a detection voltage at one or both time bases as a time base to produce the oscillating signal, and
wherein the apparatus, substantially immediately after being coupled with the second apparatus and receiving power, exchanges with the second apparatus data at a data rate according to the oscillating frequency of the oscillating signal waveform generated from the oscillator.

58. The apparatus of claim 57, wherein the oscillator receives power from the second apparatus via the interface, and wherein the apparatus, substantially immediately upon being coupled to the second apparatus via the interface exchanges with the second apparatus data at a data rate according to the oscillating frequency of the oscillating signal waveform generated from the oscillator.

59. An apparatus comprising:
an interface that can be coupled with a second apparatus to exchange therewith data at a data rate according to an oscillating frequency of an oscillating signal waveform;
an oscillator, coupled with the interface, for generating the oscillating signal waveform substantially immediately after power is supplied to the oscillator; and
a time base circuit, coupled with the oscillator, for establishing a time interval in terms of a time taken for a capacitor to charge from a reference voltage level to a detection voltage level, the time base circuit comprising:
first and second time bases, each comprising:
means for supplying a capacitor with a charging current, comprising a first semiconductor device supplied from a first power supply voltage, the device delivering the charging current to the capacitor according to a predetermined dependency on the first power supply voltage;
means for identifying the detection voltage level to signal the end of the time interval, comprising a second semiconductor device supplied from the first power supply voltage, the second semiconductor device identifying the detection voltage level value according to the same predetermined dependency on the first power supply voltage as for the first semiconductor device, whereby the time interval is made substantially independent of the first power supply voltage; and
means for discharging the capacitor to the reference voltage after the second semiconductor device identifies the detection voltage level; and
means for performing cyclical steps a) to d) below:
a) charging the capacitor of the first time base through the first semiconductor device thereof;
b) in response to the second semiconductor device of the first time base signalling the detection of the detection voltage value, charging the capacitor of the second time base through the first semiconductor device of the second time base;
c) discharging the capacitor of the first time base to the reference voltage while the capacitor of the second time base is being charged; and
d) in response to the second semiconductor device of the second time base signalling the detection of the detection voltage value, returning to cyclical step a) and discharging the capacitor of the second time base prior to cyclical step b),
thereby producing the oscillating signal on the basis of the cyclical alternation detecting the detection voltage by the first and/or the second time base(s), and wherein the apparatus, substantially immediately after being coupled with the second apparatus and receiving power, exchanges with the second apparatus data at a data rate according to the oscillating frequency of the oscillating signal waveform generated from the oscillator.

60. The apparatus of claim 59, wherein the oscillator receives power from the second apparatus via the interface, and wherein the apparatus, substantially immediately upon being coupled to the second apparatus via the interface exchanges with the second apparatus data at a data rate according to the oscillating frequency of the oscillating signal waveform generated from the oscillator.

* * * * *